(12) United States Patent
Yamaguchi

(10) Patent No.: US 6,177,894 B1
(45) Date of Patent: Jan. 23, 2001

(54) EVALUATION SYSTEM AND METHOD FOR AD CONVERTER

(75) Inventor: Takahiro Yamaguchi, Tokyo (JP)

(73) Assignee: Advantest Corporation, Tokyo (JP)

( * ) Notice: Under 35 U.S.C. 154(b), the term of this patent shall be extended for 0 days.

(21) Appl. No.: 09/183,644

(22) Filed: Oct. 30, 1998

(30) Foreign Application Priority Data

Apr. 30, 1998 (JP) ................................. 10-120324

(51) Int. Cl.[7] ..................................................... H03M 1/10
(52) U.S. Cl. ............................................. 341/120; 341/155
(58) Field of Search .................................. 341/120, 155;
375/331, 332; 329/304

(56) References Cited

PUBLICATIONS

Yamaguchi and Soma, "Dynamic Testing of ADCS Using Wavelet Transforms," Proceedings of IEEE International Test Conference, Nov. 1997, p. 379.

Grezeszczak et al., VLSI implementation of discrete wavelet transform, IEEE Transactions, vol. 4, No. 4, 1996.*

* cited by examiner

Primary Examiner—Peguy JeanPierre
(74) Attorney, Agent, or Firm—Gallagher & Lathrop; Timothy J. Lane

(57) ABSTRACT

An instantaneous differential non-linearity DNL can be determined with a high accuracy with a reduced volume of computation and independently from a testing frequency while allowing an evaluation of factors in a compounded fault. A sine signal is applied to an AD converter 14 under test, a conversion output of which is divided into a sine component and a cosine component, with local maxima or minima aligned with each other. A square sum of the individual samples is formed, and a square root of the square sum is formed to determine an instantaneous amplitude (21). The amplitude of the sine wave signal is interleaved into a series of instantaneous amplitudes (20), and a first stage of the wavelet transform (46) is applied to the interleaved series of instantaneous amplitudes, with its output being oversampled to perform a second stage of wavelet transform (46'). A maximum amplitude of the transform output is detected by peak detector 23'. A detected value is used to estimate the DNL.

29 Claims, 22 Drawing Sheets

PRIOR ART

EVALUATION SYSTEM AND METHOD FOR AD CONVERTER

BACKGROUND OF THE INVENTION

1. Field of the Invention

The invention relates to a performance evaluation system and method for evaluating the effective number of bits and the differential non-linearity of an analog-digital converter (ADC) which converts an analog signal into a digital signal and which is implemented by a single semiconductor integrated circuit or a combination of a plurality of semiconductor integrated circuits.

2. Description of the Related Art

An approach to evaluate ADC's is categorized into a static and a dynamic characteristic evaluation technique. According to the static characteristic evaluation technique, a precisely defined d.c. voltage is applied to an ADC, which is a device under test (DUT), and a response from the ADC is observed in order to estimate "a difference between the transition voltage of an actual ADC and the transition voltage of an ideal ADC" in a computer or like means based on the differential nonlinearity, hereafter referred to as DNL. The differential nonlinearity or DNL is obtained by the comparison of a difference in the upper limit amplitude of the analog signal (actual step size) as adjacent quantized codes are delivered from the ADC against an ideal step size which corresponds to 1 LSB, and enables a localized fault which depends on a particular code to be detected. Thus, DNL for ADC is defined as follows:

$$DNL = A_{in}(Q_{m+1}) - A_{in}(Q_m) - 1[LSB] \quad (1)$$

where $Q_{m+1}$ and $Q_m$ are two adjacent quantized codes and $A_{in}(Q_n)$ represents the upper limit of the amplitude of the analog signal which corresponds to a quantized code $Q_n$. It is seen that DNL equals zero if "the difference between adjacent transition amplitudes" remains constant and equals the step size corresponding to 1 LSB. However, the static characteristic evaluation technique cannot determine the nonlinearity of an ADC under test which depends on the frequency of a signal being applied.

On the other hand, according to the dynamic characteristic evaluation technique, a periodic signal is applied to an ADC under test, a response from the ADC is observed, and "a difference between the transitional voltage of an actual ADC and the transition voltage of an ideal ADC" is; estimated as in a computer. This technique has an advantage that a characteristic which closely approximates an actual operation of the ADC, which is under test, can be estimated. Dynamic characteristic evaluation techniques which utilize a sine wave (sinusoidal wave) as an input signal include a histogram approach, an FFT approach and a curve fitting approach mentioned below.

(a) In the histogram approach, a sine wave signal from a sine wave generator 11 is applied to an ADC 14 under test, as shown in FIG. 1A. Using a digital waveform which represents the response of the ADC, a histogram for respective codes is obtained by a histogram analyzer 17. A DNL estimator 18 then determines a difference between the histogram for the actual ADC and the histogram of an ideal ADC, and divided by the histogram of the ideal ADC, thus estimating the DNL. The normalization of the difference in the histograms by the histogram of the ideal ADC accounts for a non-uniform distribution of the sine wave histogram. By way of example, the relative number of samples for an output from a 6 bits ADC will be as shown in FIG. 1B where the total number of samples is equal to 1024, and the resulting DNL will be obtained as shown in FIG. 1C.

(b) In the FFT approach, a digital signal representing the response of the ADC 14 under test is Fourier transformed as by FFT (fast Fourier transform), and is separated in the frequency domain into a signal (namely, a frequency spectrum of the sine wave applied) and noises (namely, a spectrum of quantization noises or a sum of spectra other than the frequency of the sine wave applied), thus determining a signal-to-noise ratio (SNR).

Specifically, as shown in FIG. 2A, a sine wave signal from a sine wave generator 11 is passed through a low pass filter 12 to eliminate unwanted components therefrom before it is fed to a sample-and-hold circuit 13 where the sine wave signal is sampled periodically and held therein for feeding an ADC 14 under test. A response output from the ADC 14 is fed to an FFT unit 15 where it is transformed into a signal in the frequency domain, which is then fed to an SNR estimator 16. On the basis of a result of the FFT as illustrated in FIG. 2B, the SNR estimator 16 determines the signal-to-noise ratio SNR by dividing the sine wave signal component $G_{SS}(f_0)$ by the noise component $\Sigma_f G_{nn}(f)$ where $f \neq f_0$.

If the quantization noise increases in the ADC 14 for reason of fault, the signal-to-noise ratio SNR is degraded, increasing the number of bits among the total number of bits in the ADC 14 which are influenced by the quantization noise. It is then possible to estimate the effective number of bits (ENOB) of the tested ADC from the signal-to-noise ratio observed, and can be given by the equation (2) indicated below.

$$ENOB = \frac{SNR[dB] - 1.76}{6.02}[bits] \quad (2)$$

By changing the frequency $f_0$ of the sine wave signal applied, the frequency dependency of ENOB can be determined.

(c) In the curve fitting approach with the sine wave, parameters (such as frequency, phase, amplitude, offset etc.) of an ideal sine wave are chosen so that the square error between a sampled digital signal and the ideal sine wave is minimized. An rms (root-mean-square) error determined in this manner is compared against the rms error of the ideal ADC having the same number of bits to estimate the effective number of bits.

Means for generating an analog signal such as a sine wave is described in detail in "Theory and Application of Digital signal Processing" by Lawrence R. Rabiner and Bernard Gold; Prentice-Hall, 1975, in particular, "9.12: Hardware realization of a Digital Frequency Synthe-sizer", for example.

Problems with the use of conventional dynamic evaluation approach are discussed below.

(a) When the histogram approach is used to estimate the DNL of an ADC with a high precision, a very long time is needed for the determination. By way of example, an estimation of the DNL for an 8-bit ADC with a reliability of 99% and for an interval width of 0.01 bit requires 268,000 samples. For a 12-bit ADC, as many as 4,200,000 samples are required. (See, for example, Joey Doernberg, Hae-Seung Lee, David A. Hodges, 1984.) When the ADC under test exhibits a hysteresis, it is likely that any fault therein cannot be detected by using the histogram approach. Here it is assumed that when an input signal crosses a given level with a positive gradient, a corresponding code breadth is enlarged, increasing the number of observations, while when the input signal crosses the given level with a negative gradient, the corresponding code breadth shrinks, decreasing the number of observations. According to the histogram approach, no distinction is made in the direction in which the input signal changes, and accordingly, the number of observations for the positive gradient and the number of observations for the negative gradient are added together in the ultimate number of observations. Hence, an increase and a decrease in the number of observations cancel each other, and the code breadth will be one close to a code breadth for a fault-free ideal ADC. (See, for example, Ray K. Ushani, 1991.) As a consequence, the DNL which can be estimated with the histogram approach is a result of comparison of a difference in mean values of output code breadth against the ideal step size corresponding to 1 LSB. In addition, there must be a relationship other than an integral multiple between the frequency of the input sine wave and the sampling frequency of the ADC. (See, Joey Doernberg, Hae-Seung Lee, David A. Hodges 1984.)

With a histogram approach using the sine wave input, the estimated value of DNL remains little unchanged if the internal noise of the ADC is high or low. In other words, there remains a problem with a histogram approach that the influence of the internal noise of the AE)C upon the performance of the ADC cannot be exactly estimated (Ginetti, 1991). Accordingly, the histogram approach cannot be applied for the evaluation of the performance of multi-bit ADC with a high accuracy.

(b) Problems involved with the FFT approch to estimate the effective number of bits will now be described. To enable an accurate observation of the noise spectrum from the ADC under test using the FTT approach, it is necessary that the standard deviation $$\varepsilon[\hat{G}_\infty] \approx \frac{1}{\sqrt{N}}$$

be made sufficiently small. (See, J. S. Bendat and A. G. Piersol, 1986.) The number of samples N must be increased at this end. When the number of samples is increased by a factor of 4, the noise level will be 6 dB lower. The computation of FFT requires a number of real number multiplications, which is indicated below $$N \log_2\left(\frac{N}{2}\right) - 4$$

and a number of real number additions, which is indicated below $$\frac{3}{2}N(\log_2 N + 1) - 12.$$

The ADC converts an analog signal into a digital output code in accordance with the amplitude of the input signal. If the Fourier transform of the output signal is used in evaluating the conversion characteristic of ADC, non-idealities which are localized in individual output codes cannot be separated. This is because defects present within different codes are added together as noises to the rms error. Thus if there is no correlation between the defects and if different codes are influenced by them, these defects will be evaluated as "part of noises which coherently influence the same code." As a consequence, there is a likelihood that the effective number of effective bits may be underestimated. (See, Robert E. Leonard Jr.) At the same time, an analysis of individual factors which cause a reduction in the effective number of bits such as DNL, integral nonlinearity (INL), aperture jitter or noise is prohibited. Thus, the effective number of bits which can be estimated by this approach is not an instantaneous value which corresponds to each output code, but is a mean value determined over the entire output codes. Moreover, there is a need to provide a relationship other than an integral multiple between the frequency of the input sine wave and the sampling frequency of the ADC in order to randomize the quantization error. (See, Plassche, 1994.)

(c) Finally, a problem with the curve fitting approach will be considered. With this approach, it is necessary to estimate the parameter of the ideal sine wave by the method of least squares. (1) To estimate the frequency of the ideal sine wave, the Fourier transform takes place only for a single presumed frequency to determine the power. When the power reaches a local maximum, the frequency is estimated. The local maximum cannot be found unless the frequency estimation is repeated at least three times. Thus, this requires 9N (where N represents the number of samples) real number multiplications and (6N−3) real number additions. (2) The estimation of the phase requires 2N real number multiplications, (2N−2) real number additions, one real number division and one calculation of arctangent. (3) The estimation of the amplitude requires 2N real number multiplications, (2N−2) real number additions and one real number division.

Where the operation of the ADC under test largely departs from its normal operation or where the digital waveform from the ADC under test. contains a reduced number of samples, the square error does not approach a given value if the calculation of the square error is repeated while changing the parameter of the sine wave. Thus, the error diverges rather than converges. To give an example, since the variance of the frequency estimate is proportional to $1/N^3$, a sufficiently great number of samples, in excess of 4096 samples, are necessary to suppress the variance. The effective number of bits which can be estimated by this approach corresponds again to a mean value determined over the entire output codes. As a consequence, an analysis of individual factors such as harmonic distortion, noise or aperture jitter which causes a reduction in the effective number of bits is prohibited. In addition, there must be a relationship other than an integral multiple between the frequency of the input sine wave and the sampling frequency of the ADC. If the sampling frequency were an integral multiple of the frequency of the input sine wave, the input signal would be coherent to the sampling, with consequence that only a specific quantization level would be tested. (See, the paper by Ray K. Ushani.)

Problems with the prior art technique for evaluation of dynamic characteristics of the ADC can be summarized as follows: The histogram approach determines a probability density function by an approximation of a mean value of the histogram of the input sine wave. Accordingly, the DNL or the effective number of bits estimated according to any technique represents a mean value rather than an instantaneous value. As a consequence, it is difficult to estimate independently factors of a compounded fault. In the process of estimating the effective number of bits for an ADC which uses a sine wave as an input signal, a relationship other than an integral multiple must be established between the frequency of th(e input sine wave and the sampling frequency of the ADC. For this reason, an arbitrary frequency cannot be selected as the testing frequency. In addition, a very increased number of samples are required for any technique chosen. Assuming a number of samples equal to 512, the volume of computation needed is as follows:

FFT approach: 4092 real number multiplications and 7668 real number additions;

curve fitting approach: 6656 real number multiplications and 4092 real number additions.

It is a first object of the invention to provide a system for and a method of evaluating an AD converter which is capable Of estimating an instantaneous effective number of bits and an instantaneous differential non-linearity and which is capable of independently dealing with factors of a compounded fault.

It is a second object of the invention to provide a system for and a method of evaluating an effective number of bits and a differential non-linearity of an ADC which permits an arbitrary choice of a testing frequency.

It is a third object of the invention to provide a s y stem for and a method of evaluating an effective number of bits and a differential non-linearity of an AD converter which can be implemented in a simple hardware.

It is a fourth object of the invention to provide a system for and a method of evaluating an AD converter which is capable of estimating an effective number of bits or a differential non-linearity with a high accuracy of determination, without increasing the length of testing time.

It is a fifth object of the invention to provide a system for and a method of evaluating an AD converter which permits the observation of an instantaneous effective number of bits and a differential non-linearity as a function of time.

SUMMARY OF THE INVENTION

A system according to the invention comprises instantaneous amplitude calculation means and digital moving differentiator means.

A. instantaneous amplitude calculation means

The Fourier transform or the curve fitting approach represents a root-mean-square estimator, which requires an increased number of samples in order for the effective number of bits to be estimated with a high accuracy. In addition, a very long time interval is required to determine the probability density function of the sine wave accurately. Accordingly, the Fourier transform approach or the combination of the curve fitting approach and the histogram approach cannot achieve the first, the second and the third object mentioned above. To accomplish these objects, new means is required which can separate non-idealities which are localized in the respective output codes from the ADC. In this respect, in accordance with the invention, instantaneous amplitude calculation means 21 which receives a digital signal comprising output codes from the ADC 14 as an input is used, as shown in FIG. 3.

B. instantaneous amplitude calculation means and digital moving differentiator means In the prior art practice, a combination of Fourier transform means and SNR estimator has been used to estimate a mean effective number of bits of a ADC under test indirectly. In accordance with the invention, the combination of the Fourier transform means and the SNR estimator is replaced by a combination of Hilbert pair resampler 19, instantaneous amplitude calculation means 21, interleaver means 20, digital moving differentiator means 22 and local maximum or maximum detecting means (peak finder) 23.

Specifically, according to the invention, a sine wave from a sine wave generator 11 is applied to an ADC 14 under test, as shown in FIG. 3, and an instantaneous amplitude of the output from the ADC 14 is calculated by instantaneous amplitude calculator 21 while the Hilbert pair resampler 19 resamples a cosine wave and a sine wave which corresponds to a Hilbert transform pair of the cosine wave output from the ADC 14. The instantaneous amplitude and a known amplitude of the input sine wave are fed to interleaver means 20 where an interleaved signal is formed and is then processed by moving differentiator means 22. Peak finder means 23 determines a maximum value of the absolute amplitude from the differentiator 22, thereby allowing an instantaneous effective number of bits to be determined therefrom.

In FIG. 4, parts corresponding to those shown in FIG. 3 are designated by like numerals as used before. As shown, the interleaved signal from the interleaver means 20 is subject to a first stage transform in a wavelet transform means 46, and a maximum value of the absolute amplitude of the transform output from the first stage is detected by the peak finder means 23, allowing the instantaneous effective number of bits to be determined therefrom.

In the estimation of the instantaneous differential non-linearity DNL in accordance with the invention, the instantaneous amplitude from the instantaneous amplitude calculation means 21 is fed to digital moving differentiator means 22', and a maximum value of the absolute magnitude of the moving difference output is detected by peak finder means 23', as shown in FIG. 3, thus determining an instantaneous DNL.

Alternatively, as shown in FIG. 4, the output from the first stage wavelet transform may be fed to wavelet transform second stage 46' where the output is oversampled to perform another stage of wavelet transform, thus deriving a second stage output from the wavelet transform. A maximum value of the absolute magnitude may be determined by peak finder means 23', thus determining an instantaneous DNL.

The operation of the invention will be described below.

A. instantaneous amplitude calculation means

Non-idealities which are localized in the respective output codes from an ADC under test cannot be directly determined with the FFT approach or the curve fitting approach. For example, according to the FFT approach, a digital signal comprising output codes from the ADC is; subject to a Fourier transform, and a line spectrum which corresponds to an ideal sine wave is estimated in the frequency domain. The estimated line spectrum is eliminated from the spectrum which is determined by the Fourier transform to provide a difference spectrum. The difference spectrum is finally made to correspond to non-idealities of the ADC under test. In a similar manner, according to the curve fitting approach, an ideal sine wave, is estimated by repeating calculations so that a square error between the sample digital waveform and the ideal sine wave is minimized. Non-idealities of the ADC under test are estimated by way of difference vector between the sampled digital waveform vector and the ideal sine wave vector.

By contrast, the invention utilizes instantaneous amplitude calculation means 21, which permits a direct determination of non-idealities which are localized in the respective output codes from the ADC under test. The principle therefor will be described below.

A digital waveform $\hat{x}[n]$, representing a response of an ADC under test, is different from an analog waveform $x[n]$ of the input, and a difference between the digital waveform $\hat{x}[n]$ and the analog waveform $x[n]$ represent a quantization error $e[n]$.

$$e[n]=\hat{x}[n]-x[n] \tag{3.1}$$

A maximum value of the quantization error is equal to one-half the quantization step width x, and hence we have:

$$-\Delta/2 \leq e[n] \leq \Delta/2 \tag{3.2}$$

For purpose of brevity, a normalized quantization error $\epsilon[m]$ is used and is defined as indicated below.

$$\epsilon[n]=(2/\Delta)e[n] \quad (3.3)$$

The extent of the normalized quantization error is given as follows:

$$-1 \leq \epsilon[n] \leq 1 \quad (3.4)$$

For purpose of brevity, it is assumed that an input signal is a cosine wave. The digital wave form $\hat{x}[n]$, representing a response from an ADC under test is represented as a sum of input cosine wave and non-idealities $e[n]$ such as the quantization error of the ADC under test.

$$\hat{x}[n]=A\cos(2\pi f_0 n+\Phi)+(\Delta/2)\epsilon[n] \quad (4.1)$$

The digital signal representing a response from the ADC under test which responds to the cosine wave input always contains a sine wave $\hat{x}[m]$ which is related to the cosine wave by Hilbert transform relationship.

$$\hat{x}[m]=H(x[n])+e[m]=A\sin(2\pi f_0 n+\Phi)+(\Delta/2)\epsilon[n] \quad (4.2)$$

Thus, the Hilbert transform pair resampler 19 can resample the actual waveform which is sampled to produce a complex signal $\hat{x}[n]+j\hat{x}[m]$. When $\hat{x}[n]+j\hat{x}[m]$ is fed to the instantaneous amplitude calculation means 21, an instantaneous amplitude $z[n]$ is calculated and delivered.

$$z(n)=\sqrt{(\hat{x}[n]^2+\hat{x}[m]^2)}=A+(\Delta/2)\{\epsilon[n]\cos(2\pi f_0 n+\Phi)+\epsilon[m]\sin(2\pi f_0 n+\Phi)\} \quad (5)$$

$\epsilon[n]$ or $\epsilon[m]$ is equal to zero for an ideal ADC having an infinite number of bits, and hence there results an envelope of a given amplitude A. Conversely, an ADC under test which has a finite number of bits produces an envelope of error signals as shown in FIG. 5A. Thus, it may be regarded as including the cosine wave and the sine wave in the input signal as carrier waves, the amplitude of which is modulated in accordance with non-idealities such as $(\Delta/2)$ $\epsilon[n]$ or $(\Delta/2)$ $\epsilon[m]$. Accordingly, information representing fault of the ADC under test appears in the amplitude modulation terms of the equation (5). The amplitude modulated signal has an extent defined by the following inequality:

$$A-\sqrt{2}\Delta/2 \leq |z[n]| \leq A+\sqrt{2}\Delta/2 \quad (6.1)$$

It will be seen from the equation (5) that the difference between $|z[n]|$ and the given amplitude A is given by the following equation:

$$||z[n]|-A|=|\Delta/2\{\epsilon[n]\cos(2\pi f_0 n+\Phi)+\epsilon[m]\sin(2\pi f_0 n+\Phi)\}| \quad (6.2)$$

During the dynamic performance test of the ADC under test, it is more important to evaluate the worst case value rather than the mean value of the effective number of bits. To estimate the worst case value of the effective number of bits, a maximum value or a minimum value in the amplitude modulated signal given by the equation (6.2) may be used.

In addition, when a local maximum or a minimum value in the amplitude modulated signal given by the equation (6.2) is; utilized in evaluating the worst case value of the effective number of bits of the ADC under test, it is possible to determine an instantaneous value of the effective number of bits which corresponds to the period of the input sine wave. For example, the aperture jitter is proportional to the ramp of an input signal to the ADC while noises occur without correlation to the input signal. Accordingly, it is possible to render a determination of whether a single fault or a compounded fault is involved, by seeing if a fault occurring in an amplitude modulated signal is periodic, remains substantially constant, or comprises substantially constant noise on which the periodic pattern is superimposed. In this manner, the instantaneous amplitude calculation means which is used in the accordance with the invention enables non-idealities which are localized in the respective output codes from the ADC under test to be determined directly.

Assuming a number of samples equal to 512, the required volume of computation is as follows:
FFT approach: 4092 real number multiplications and 7668 real number additions;
curve fitting approach: 6656 real number multiplications and
4092 real number additions;
instantaneous amplitude calculation means:
1024 real number multiplications and
0512 real number additions.

An estimation of DNL is lead from the standpoint of the quantization error. When the amplitude of a test signal decreases monotonously and becomes equal to a lower limit amplitude LB(code(k−1)) of an output code k, a quantization error assumes a local maximum $\Delta/2$. When the amplitude of the test signal further decreases monotonously and becomes equal to the upper limit UB(code(k)) of a next output code k−1, the quantization error assumes a local minimum $-(\Delta/2)$. Accordingly, if a sufficient number of samples are available, a calculation of the difference between the local maximum and the local minimum in the quantization error allows the quantization step width $\Delta$ to be estimated. Specifically, when a difference $\Delta$ between an upper limit (or a lower limit) quantization error for a code and a lower limit (or upper limit) quantization error for a neighboring code is compared against an ideal step width $\Delta_{id}$ corresponding to 1 LSB, it is seen that this corresponds to the DNL. Thus $$DNL(e[n],k)=\{UB(e[n,code(k)])-LB(e[n+1,code(k-1)])/\Delta_{id}-1 \quad (7.1)$$

where UB(e[n, code(k)]) represents the upper limit of the quantization error which corresponds to a code (k), while LB(e[n+1, code(k−1)]) represents the lower limit of the quantization error which corresponds to a code (k−1). However, the quantization error signal cannot be directly used in the estimation of DNL. When the instantaneous amplitude signal is used as a test signal, it follows that $$DNL(n,k)=(\max\{||z[n]|-z[n+1]|\})/\Delta_{id}-1 \quad (7.2)$$

This means that the DNL(n, k) can be determined by the digital moving differentiator means 22' and the peak finder means 23' shown in FIG. 3. The instantaneous amplitude calculation means 21 according to the invention enables non-idealities which are localized in respective output codes from the ADC under test to be determined directly.

In this manner, the instantaneous calculation means of the present invention provides a system and a method which realize the achievement of the first, the second and the third object.

B. digital moving differentiator means

The function of and the effect brought forth by the digital moving differentiator means will now be described.

A single pulse signal $1-\Delta\delta(t-\tau T)$ having an amplitude equal to the quantization step width $\Delta$ (FIG. 5B) is input to digital moving differentiator means 22 or 22', and only 512 samples are sampled. The impulse signal having the amplitude equal to the quantization step width corresponds to an output code from the ADC. As shown in FIG. 5C, a quantity $-20\log_{10}(\Delta/2)$ which is proportional to the quantization step width of the ADC is observable.

In a similar manner, a single pulse signal $1-\Delta\delta(t-\tau)$ having an amplitude equal to the quantization step width A is input to the wavelet transform means 46, and only 512 samples are sampled. As shown in FIG. 6A, quantities $-20 \log_{10}(\Delta/2)$, $-20 \log_{10}(\Delta/4)$, ..., $-20 \log_{10}(\Delta/256)$ which are proportional to the quantization step width of the ADC are observable in multiple resolutions or 8 scales. A scale is the reciprocal of the frequency, and changes from $2^8$ to $2^1$ in the present example. Conversely, it is seen that there exist from $2^1$ to $2^8$ wavelets along the time axis. The number of wavelets which corresponds to the frequency or "m" of $2^m$ is referred to as a level. However, it is to be noted that Martin Vetterli et al. refers to a scale which corresponds to the period or "j" of $2^j$ as a level. FIG. 6B represents an observation of a result of a wavelet transform at each scale level. Accordingly, it is possible to detect whether or not the quantization step width of the ADC is working properly by using the digital moving differentiator means 22, 22' or the wavelet transform means 46, 46'. However, if the single pulse signal is subject to the Fourier transform, the spectrum will be spread across the entire frequency band of observation, preventing the detection of whether or not the quantization step width of the ADC is working properly. It is to be noted that each logarithmic interval (such as (0, 1), (1, 2) . . . , (6, 7), (7,8)) shown in FIG. 6B provides an observation of an entire time region (from 0 to 256) in a compressed manner.

Assuming a number of samples equal to 512, the required volume of computation will be as follows:

digital moving differentiator means:
1022 real number multiplications and
0511 real number additions Daubechies wavelet transform means:
4088 real number multiplications and
3066 real number additions C. interleaver means and digital moving differentiator means The function of and the effect brought forth by the interleaver means 20 will now be described. As shown in FIG. 7, the amplitude modulation signal $|z[n]|$ given by the equation (5) and the amplitude A of the cosine wave being applied are input to the interleaver means 20, whereupon the following signal f is delivered:

$$f=(A, |z(1)|, A, |z(2)|, \ldots, A, z[[n]], \ldots)$$

The signal f is in the form of a train of sub-signals (A, $|z[n]|$), or an impulse train having a height $A-z[[n]]$. From the theory of the single pulse signal mentioned in the preceding paragraph, it follows that the height of the impulse train can be estimated if the signal f is input to the digital moving differentiator means 22 or the wavelet transform means 46.

A maximum value of the output from either digital moving differentiator means 22 or the wavelet transform means provides a dynamic range DR of the ADC under test.

$$DR=-20\log_{10}[(1/\sqrt{2})(\Delta/2)]=-20\log_{10}[\frac{1}{2}^{B+0.5}] \text{ (dB)} \quad (8.1)$$

Conversely, the instantaneous effective number of bits B of the ADC under test can be estimated from the observed value of DR.

$$B=(DR/20\log_{10}2)-0.5 \text{ (bit)} \quad (8.2)$$

When signal f is input to the digital moving differentiator means 22 (FIG. 3), or the first stage 46 of the wavelet transform means (FIG. 4), the transformed outputs from the first stage 46 and the second stage 46' of the wavelet transform means enable the instantaneous effective number of bits (ENOB) and the instantaneous DNL to be observed as a function of time as indicated in FIG. 8B with respect to the interleaved signal f shown in FIG. 8A. It is also possible to estimate the instantaneous effective number of bits (ENOB) using the equation (8.2) from the maximum value delivered from maximum value detecting means 23, to which the absolute amplitude of the output from the digital moving differentiator means 22, 22' or the first stage 46 of the wavelet transform means is input.

This method of estimating the instantaneous effective number of bits have been verified while changing the number of bits in the ADC under test from 4 to 20, and a result is shown in FIG. 9A where "+" represents an instantaneous effective number of bits which is estimated in response to an input comprising a single pulse signal and "○" represents an instantaneous effective number of bits which is estimated by using a combination of the instantaneous amplitude of the calculation means, the interleaver means, the digital moving differentiator means or Haar-Wavelet transform means and maximum detecting means in response to an input to the ADC under test which comprises a sine wave. In this Figure, "×" represents an instantaneous effective number of bits which is estimated by using a combination of the instantaneous amplitude calculation means, the interleaver means, the digital moving differentiator means or Daubechies-Wavelet transform means and maximum detecting means in response to an input to the ADC under test which comprises a sine wave. It will be seen that an instantaneous effective number of bits which corresponds to the effective number of bits in the ADC under test is estimated according to any technique.

When the amplitude modulated signal $|z[n]|$ given by the equation (5) is input to the digital moving differentiator means 22' or when the signal f is input to the second stage 46' of the wavelet transform means, an instantaneous DNL can be estimated. It will be noted that a normal sampling used in the Haar-Wavelet transform means uses a filtering of a pair of an even-numbered and odd-numbered waveform data (where samples are counted as 0-th, first, second, and so on). When the even-number indexing is employed, if a pair of odd-numbered and even-numbered samples corresponds to a fault, this fault cannot be detected. Accordingly, in the second stage of the wavelet transform means, a travel along the time axis is taken as one sample, or an oversampling is made, so that the detection is enabled if the fault corresponds to either an even-numbered or an odd-numbered sample. Specifically, as shown in FIG. 7, the interleaved signal f is subject to the wavelet transform in the first stage 46 of the wavelet transform means, and accordingly, one corresponding value is obtained for the input signal $|z[n]|$ as indicated by a mark "○". However, when a pair of even-numbered and odd-numbered samples from the transform output from the first stage which is marked by "○" is subject to the filtering in the second stage 46' of the wavelet transform means, the arrangement shown in FIG. 7 can provide a transform output for only every fourth time segment. To overcome this, the transform output from the first stage is, oversampled. Specifically, in addition to the filtering applied to the pair marked "○" at times (1, 2) and the pair marked "○" at times (3, 4), the filtering is also applied to the pair marked "○" at times (3, 4) and the pair marked "○" at times (5, 6). This takes place at the second stage of the wavelet transform. In this manner, while only one value is obtained every fourth time segment originally, two values are obtained as indicated by □ marks in FIG. 7, thus allowing the detection wherever the fault is present.

When the signal f is input to the second stage 46' of the wavelet transform means, the output from the low pass filter in the first stage of the wavelet transform means will be $(A|z[n]|)/2$. Thus, it is reduced by a factor of two and an offset $A/2$ is added, but it remains to be analogous to the original amplitude modulated signal $|z[n]|$. Accordingly, when this signal is input to the high pass filter in the second stage 46' of the wavelet transform means, the Haar-Wavelet permits a difference between adjacent samples to be calculated. The output signal from the high pass filter in the second stage 46' of the wavelet transform means is then input to the maximum detecting means 23', which delivers a maximum value. Using this maximum value in the equation (9.1), given below, it is possible to estimate an instantaneous DNL.

$$DNL(n, k) = (2^2/\Delta_{id})\max\{|\Delta[n]/2^2|\} - 1 \text{ [LSB]} \quad (9.1)$$

where $\Delta[n] = |z[n]| - |z[n+1]|$.

When the amplitude modulated signal $|z[n]|$ is input to the digital moving differentiator means 22', the latter calculates a difference between adjacent $|z[n]|$'s and delivers $\Delta[n]/2$. Accordingly, using the maximum value delivered, the following equation (9.2) may be used to estimate the instantaneous DNL.

$$DNL(n, k) = (2/\Delta_{id})\max\{|\Delta[n]/2|\} - 1 \text{ [LSB]} \quad (9.2)$$

FIG. 9B shows the method of estimating the instantaneous DNL (indicated by ○ marks) according to the invention (DWT simulation) in comparison to the number of samples required in the estimation of the DNL according to the histogram approach with the sine wave input (indicated by + marks). With the present invention, the instantaneous DNL can be estimated with a reduced number of samples. A solid line curve represents the theoretical value according to the histogram approach. FIG. 10A indicates a comparison of the sensitivity to internal noises within ADC between the present invention (DWT simulation) and the histogram approach with a sine wave input. It will be seen that according to the histogram approach with a sine wave input where "+" represent data for 4096 sample and "×" represent data for 16384 samples, there is little change in the estimated DNL value if there is increase in the noise. In other words, the histogram approach cannot properly estimate the influence of internal noise within ADC upon the performance of the ADC. On the other hand, with the present invention where black solid circles represent data for 2048 samples while circles represent data for 512 samples, the estimated DNL value increases in proportion to the increase in the internal noises within the ADC. Accordingly, the invention lends itself to the evaluation of the performance of the multi-bit high accuracy ADC.

In this manner, a combination of the instantaneous amplitude calculation means and the digital moving differentiator means or wavelet transform means according to the invention provides a system which realizes the fourth and the fifth object mentioned above.

D. Summary

The instantaneous amplitude calculation means according to the invention provides (1) a system for evaluating an instantaneous effective number of bits or differential non-linearity which is capable of independently dealing with factors of a compounded fault, (2) a system for evaluating an effective number of bits or differential non-linearity which allows an arbitrary frequency to be selected, and (3) a system for evaluating effective number of bits or differential non-linearity which can be implemented with a simple hardware.

In addition, a combination of the instantaneous amplitude calculation means and the digital moving differentiator means or wavelet transform means according to the invention provides (4) a system for evaluating an effective number of bits or differential non-linearity which provides a high accuracy of determination without increasing the testing time length, and (5) a system which permits an instantaneous effective number of bits or differential non-linearity to be observed as a function of time.

DETAILED DESCRIPTION OF THE PREFERRED EMBODIMENTS

Figure 1A:
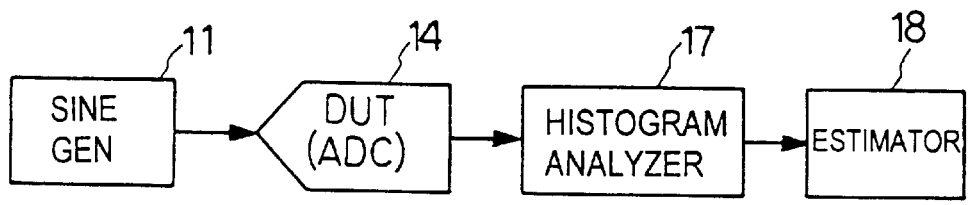
FIG. 1A is a schematic illustration of a functional arrangement of a conventional method of evaluating DNL.
Figure 1B:
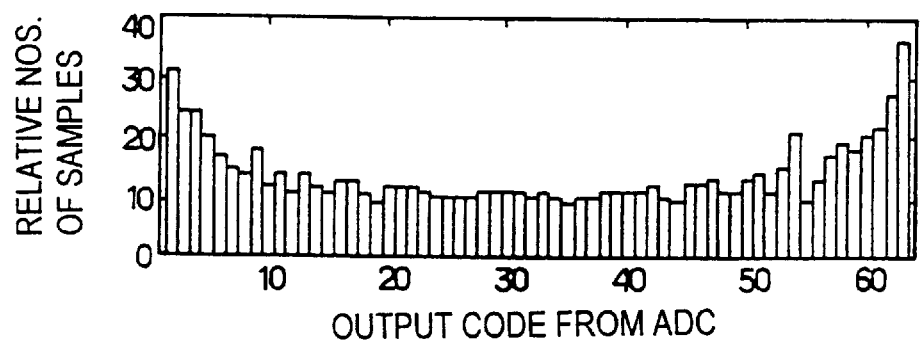
FIG. 1B graphically depicts an exemplary histogram for output codes.
Figure 1C:
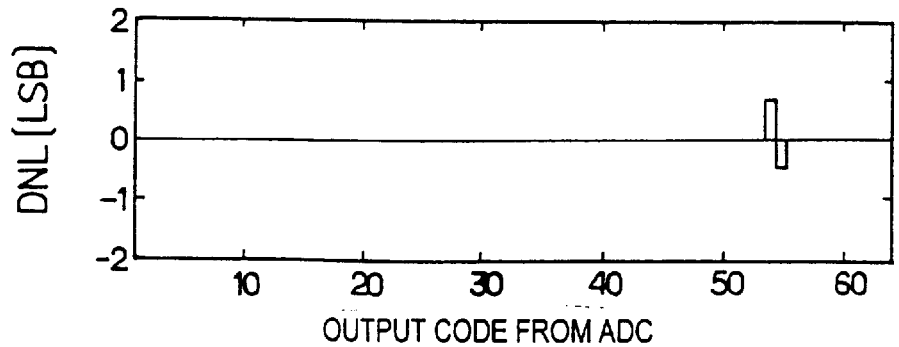
FIG. 1C graphically shows a DNL determined according to the histogram approach.
Figure 2A:
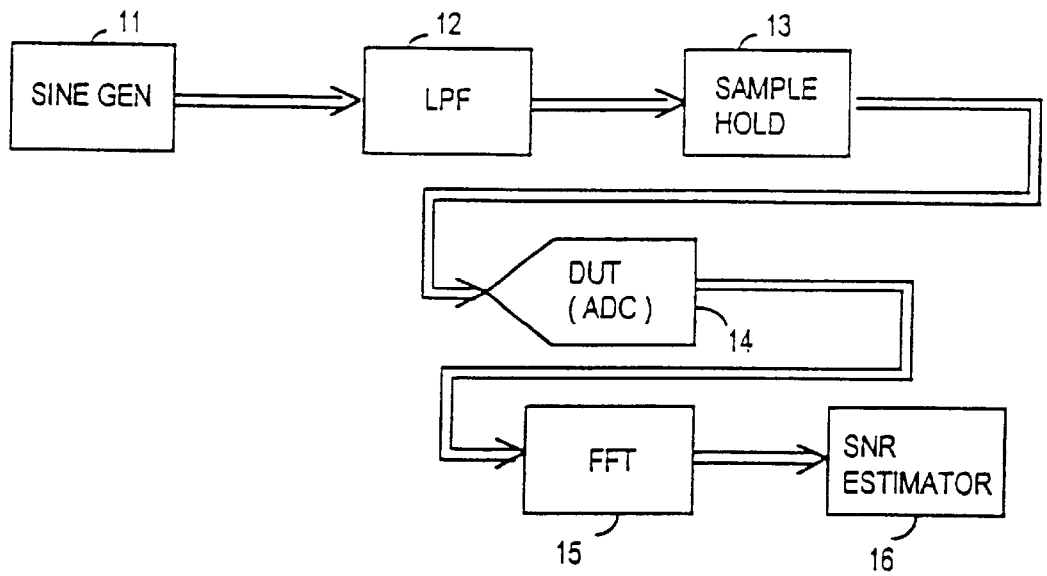
FIG. 2A is a block diagram of an effective number of bits estimator using the conventional FFT approach.
Figure 2B:
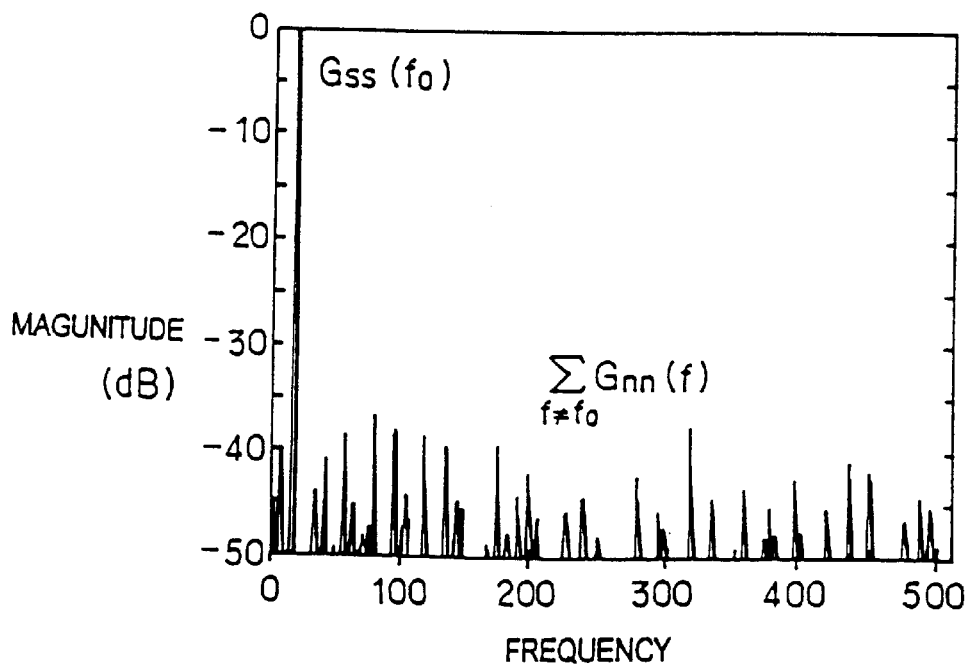
FIG. 2B illustrates the principle of the method of estimating an effective number of bits using the FFT approach.
Figure 3:
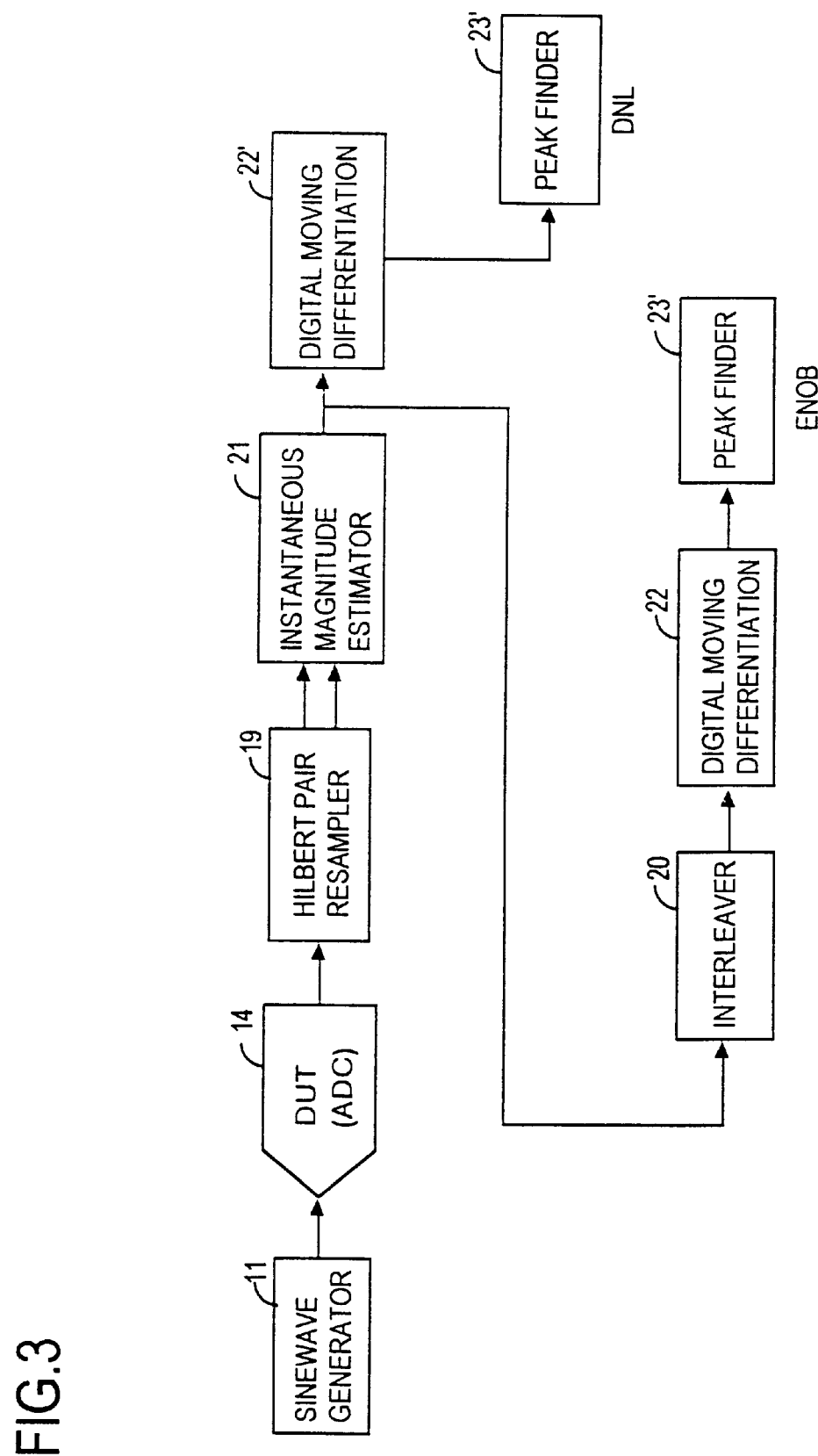
FIG. 3 is a schematic view illustrating the principle of the combination of instantaneous amplitude calculation means and digital moving differentiator means according to the invention.
Figure 4:
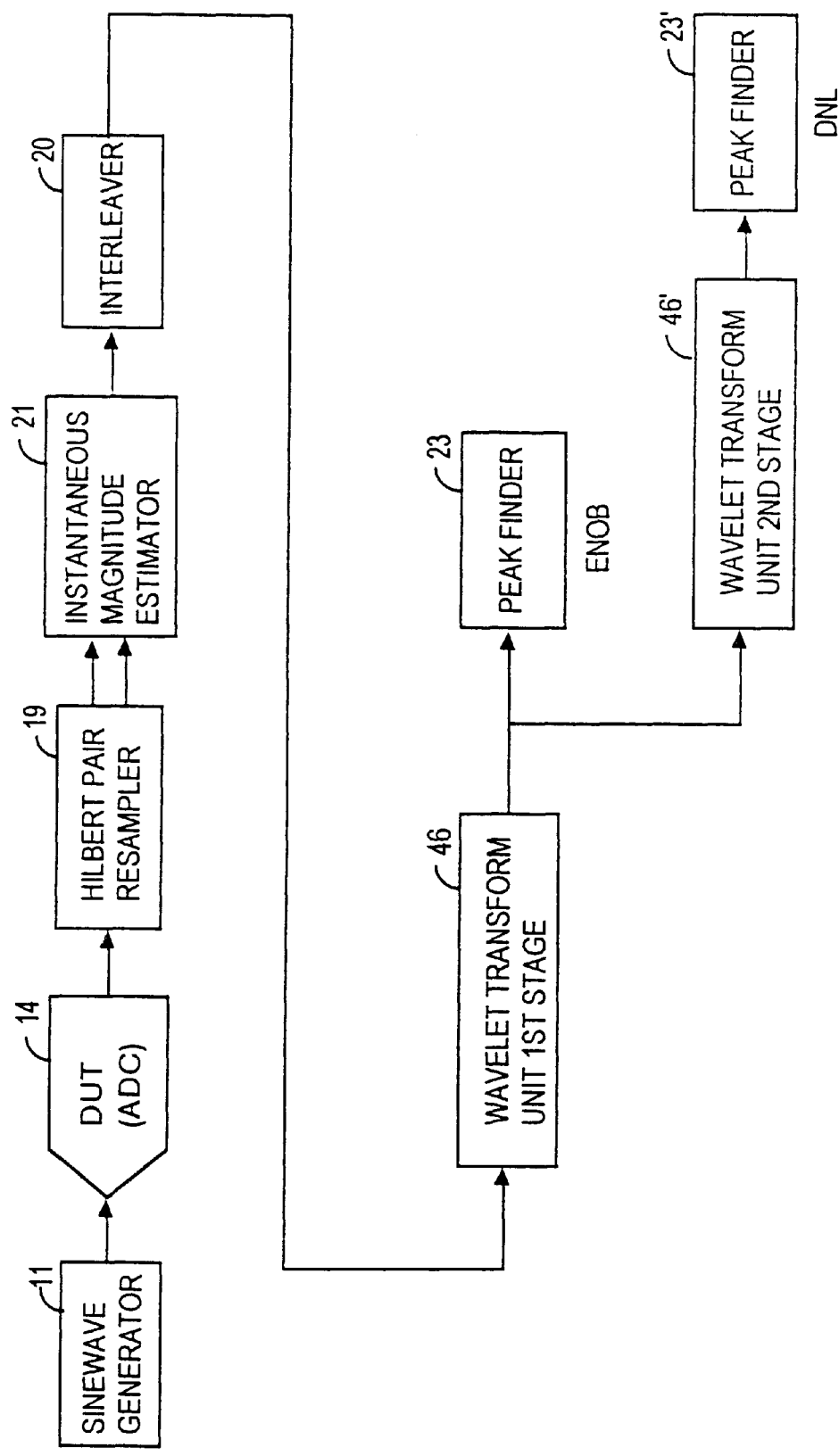
FIG. 4 is a schematic view illustrating the principle of the combination of instantaneous amplitude calculation means, interleaver means and wavelet transform means used according to the invention.
Figure 5A:
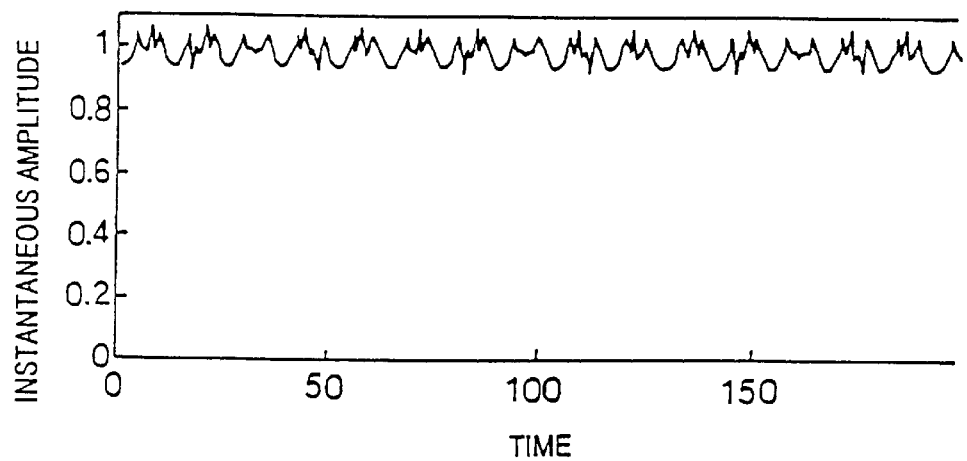
FIG. 5A graphically shows an instantaneous amplitude which is estimated from an output from 4-bit ADC.
Figure 5B:
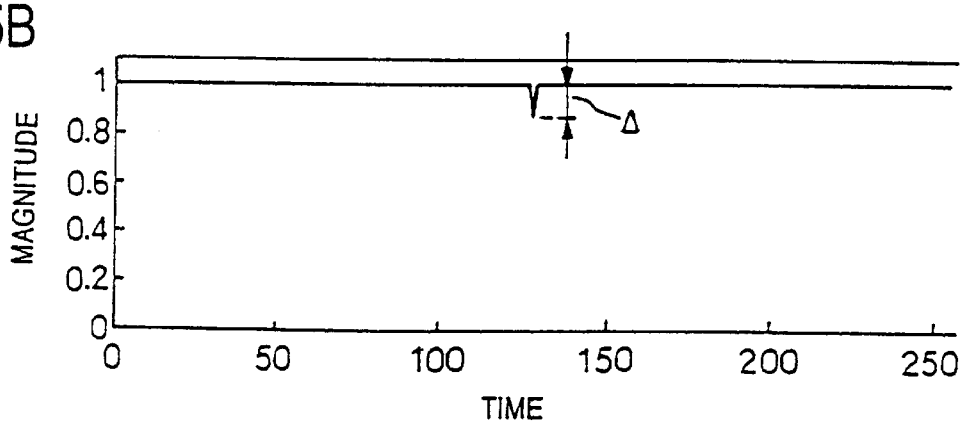
FIG. 5B illustrates a single pulse signal.
Figure 5C:
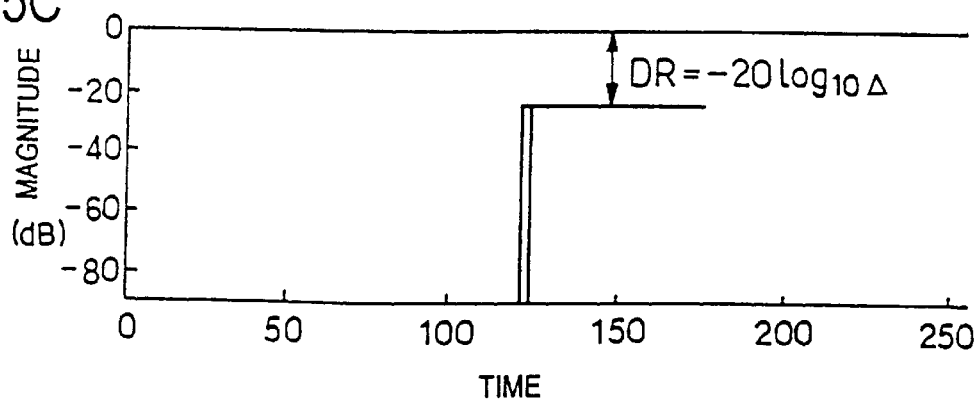
FIG. 5C graphically shows an output from digital moving differentiator means when the signal pulse signal shown in FIG. 5B is input thereto.
Figure 11:
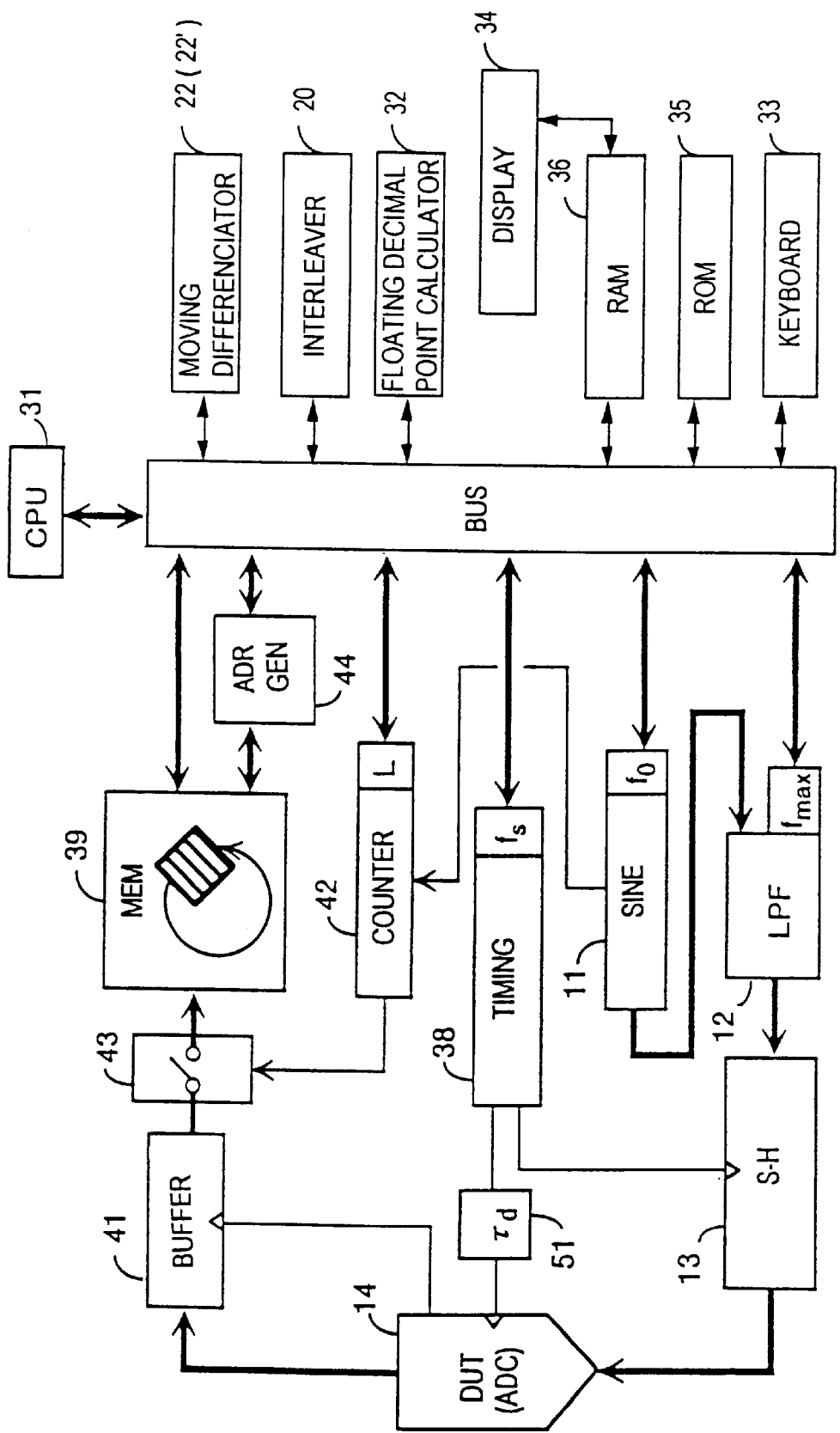
FIG. 11 is a schematic view showing the functional arrangement of a system evaluating an AD converter according to the invention.

Referring to the drawings, several preferred embodiments will now be described in detail. FIG. 11 shows a system for evaluating an ADC in accordance with the invention, and it is to be noted that parts corresponding to those shown in FIGS. 3 and 4 are designated by like numerals as used before. The system comprises CPU 31 which performs data entry and delivery and calculations, a floating decimal point arithmetic chip 32, a keyboard or a front panel 33 which is used to enter parameters or instructions, a display 34 which displays a menu selected by a user or results of determinations, and ROM 35, RAM 36 or disk unit which store user inputs and data. In addition, the system comprises interleaver means 20, and digital moving differentiator 22 (22'). A signal generator 11 which generates an analog signal is adapted to generate a sine wave, which is applied to an ADC 14 under test (or DUT). A timing controller 38 produces a clock, which is applied to the ADC 14 to control the timing of the A/D conversion within ADC 14. A waveform memory (RAM Signal) 39 reads a digital signal which is stored in a buffer 41 connected to the output of the ADC 14 in synchronism with the end of conversion signal from the ADC 14, for example. The waveform memory 39 may be written into in a sequential manner beginning with an address 0, and when a last address is written into, the write-in sequentially continues beginning from address 0 again. The waveform memory 39 may be of a size of 1024, for example (having a memory address of 0–1023). The analog signal generator 11 also generates a trigger signal, which starts a remaining sample counter 42. When the count in the counter 42 is equal to zero, for example, a switch 43 which couples the buffer 41 to the waveform memory 39 is turned off, thus terminating the write-in of the digital signal into the waveform memory 39. However, the write-in into the memory 39 is continually effected up to such point in time. Assuming that the last write-in address to the waveform memory 39 is 500 (1023), this last write-in address is read out from an address generator 44 and is incremented by one for remainder calculation, thus providing an address of 501 (0) where an oldest sample is stored. Thus, when the last write-in address to the waveform memory 39 is read out from the address generator 44 and incremented by one, individual samples can be read out in sequential order beginning with the oldest sample.

The frequency $f_0$ and the amplitude A of the sine wave, the sampling frequency fs, the highest frequency $f_m$ of the pass band of a low pass filter 12, and a number of remaining samples L which is predetermined as a trigger condition can be selected by a user and entered through the keyboard 33 or the front panel. These parameters may be previously written into a file saved in a disc and read from the file upon commencement of the test. CPU 31 writes these parameters into control registers associated with the signal generator 11, the low pass filter 12 and the waveform memory 39.

Figure 12:
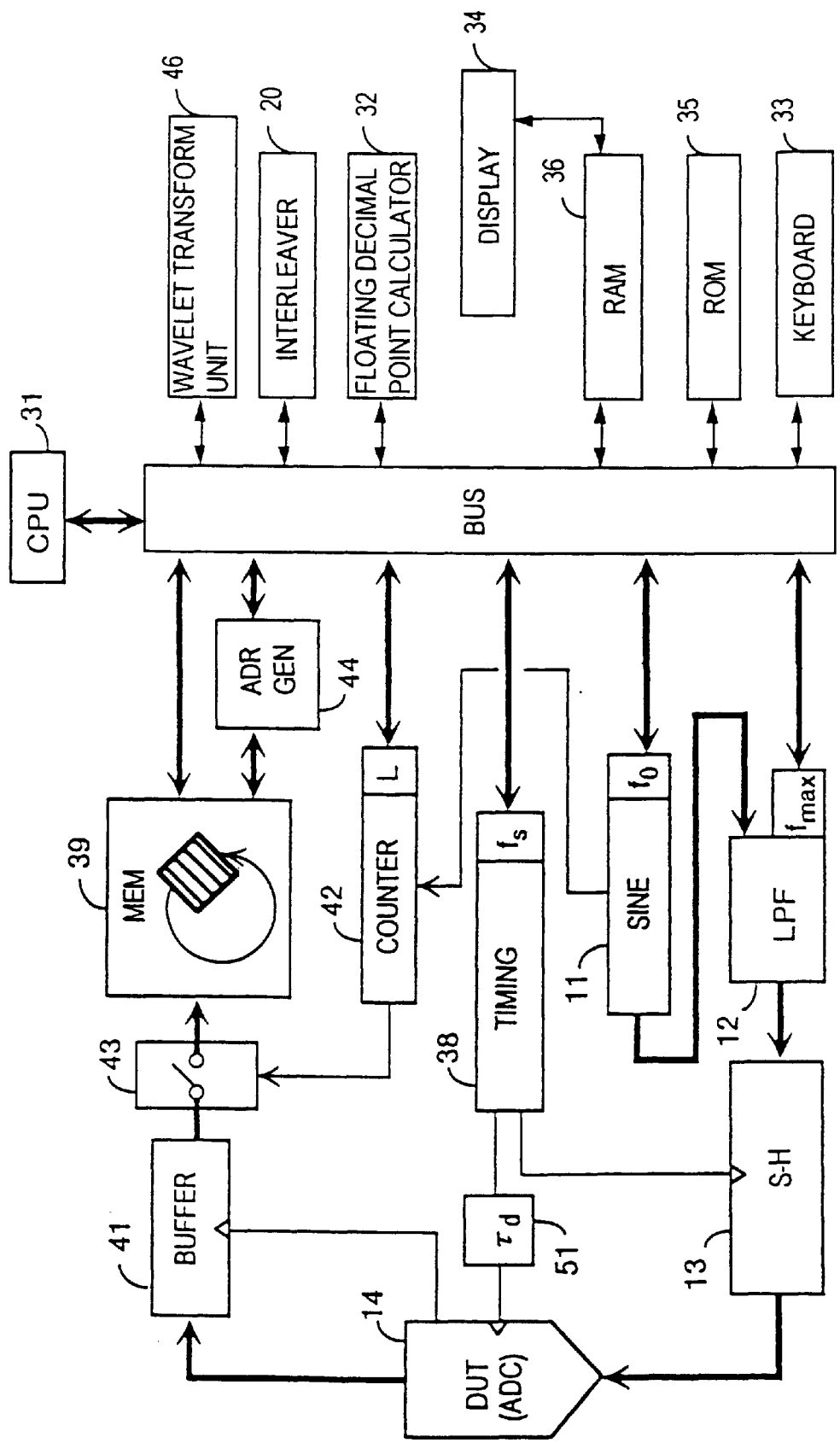
FIG. 12 is a schematic view showing the functional arrangement of another form of a system for evaluating AD converter according to the invention.

FIG. 12 is a schematic view showing another arrangement of a system for evaluating an ADC according to the invention. Parts corresponding to those shown in FIG. 11 are designated by like numerals as used before. A difference over the arrangement of FIG. 11 resides in that wavelet transform means 46 (46') is used in place of the digital moving differentiator 22 (22') shown in FIG. 11.

Figure 13:
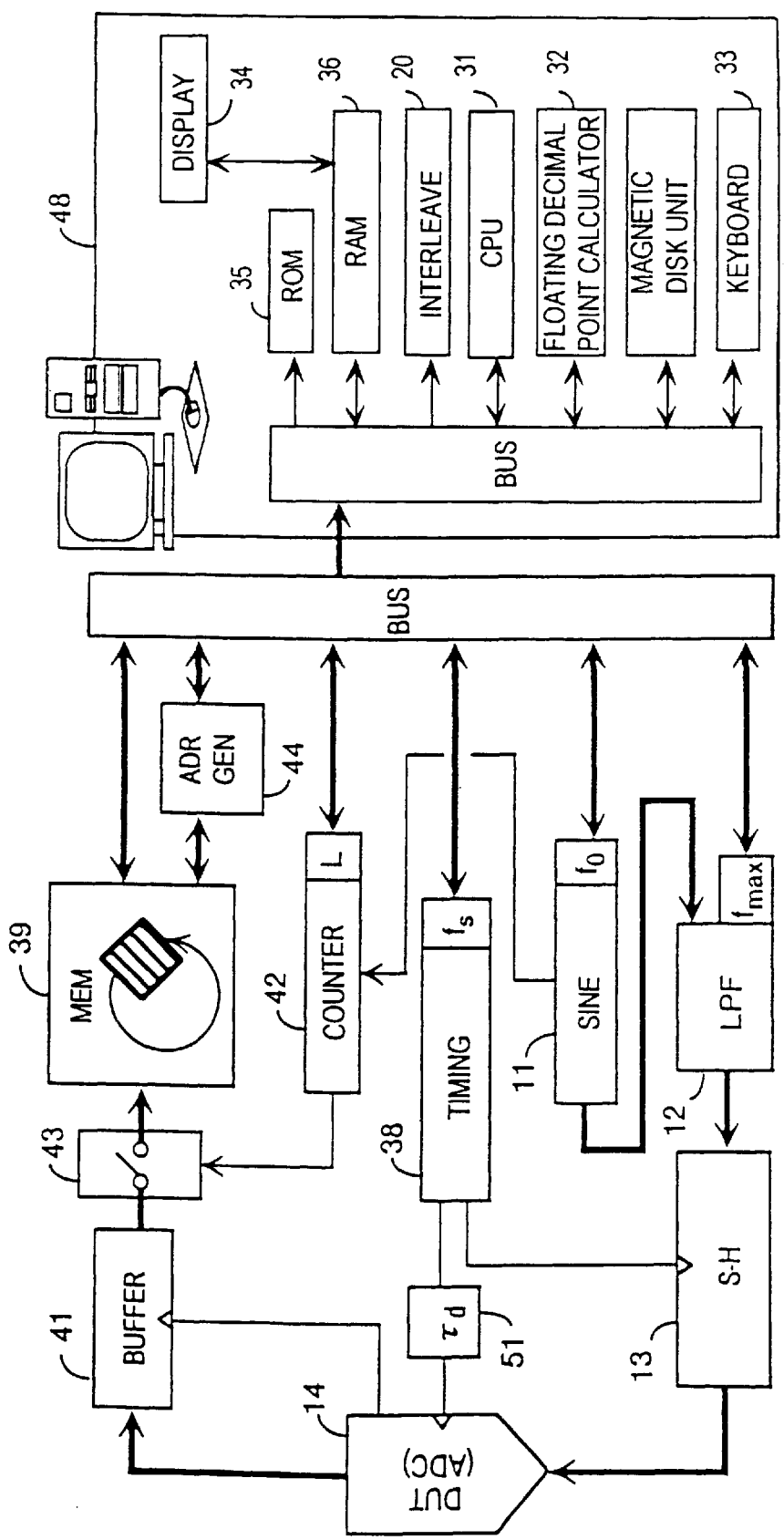
FIG. 13 is a schematic view showing the functional arrangement of a further embodiment of a system for evaluating AD converter according to the invention.

FIG. 13 is a schematic view showing a further arrangement of a system for evaluating an ADC according to the invention, which differs from the arrangements shown in FIGS. 11 and 12 in that a control computer 48 exercises a control over the ADC evaluation system. The computer may comprise SPARC computer available from Sun Microsystems. This computer has the functions of CPU 31, the floating decimal point calculator chip 32, the keyboard 33, the display 34, ROM 35, RAM 36, the interleaver 20, the digital moving differentiator 22 (22') or wavelet transform means 46 (46').

Embodiment 1

Figure 14A:
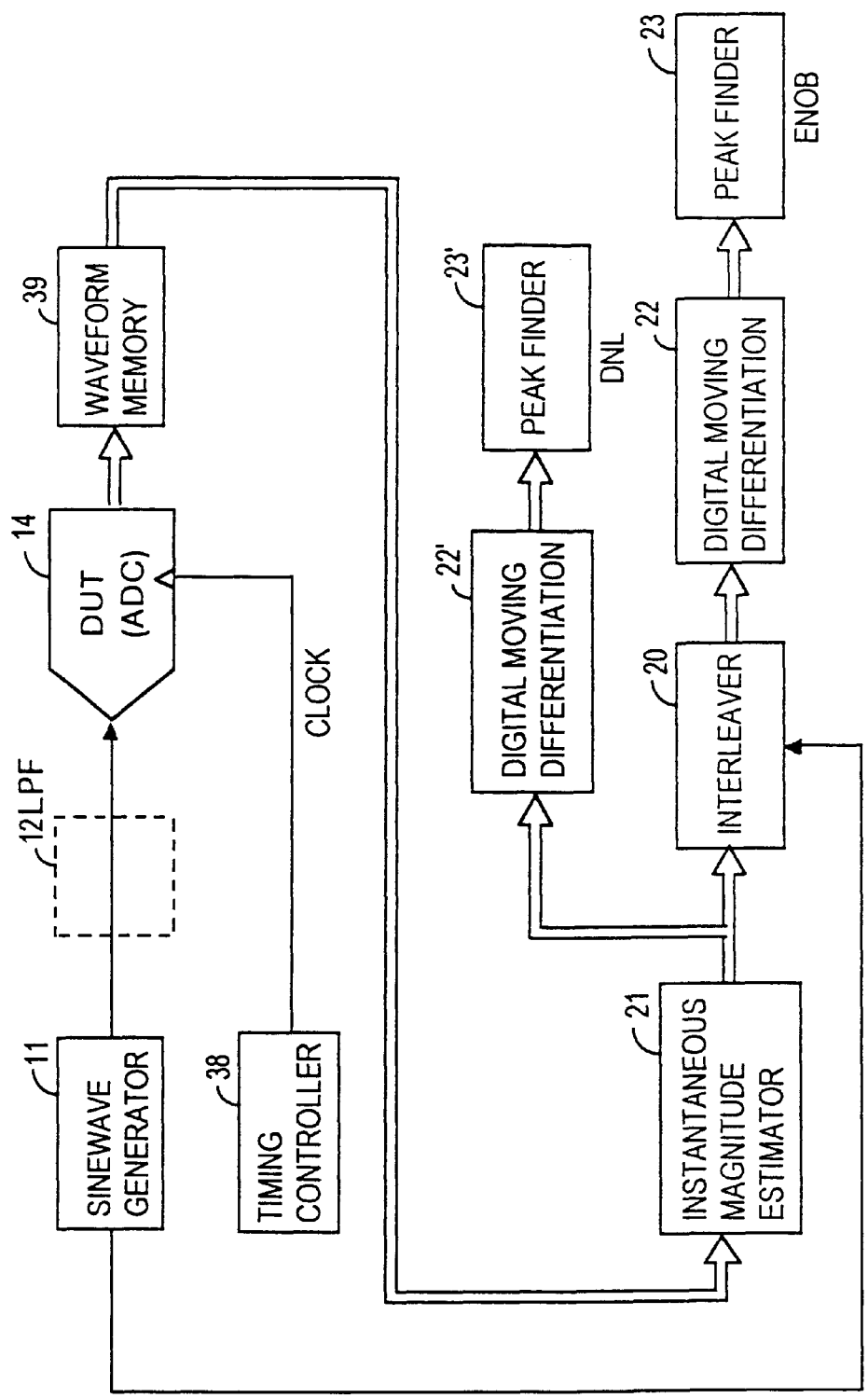
FIGS. 14A–B is a schematic view showing the functional arrangement of a system according to the invention which utilizes digital moving differentiator.

FIG. 14A shows a schematic view of a system for evaluating an effective number of bits and differential non-linearity according to the invention, which functions to estimate an effective number of bits and DNL of an ADC 14 which internally contains a sample-and-hold circuit. A signal generator 11 which generates an analog signal provides a sine wave, which is applied to the ADC 14 under test. A timing controller 38 produces a clock which is applied to the ADC 14 for controlling the timing of the A/D conversion operation thereof. A waveform memory 39 accumulates a digital signal from the ADC 14 in synchronism with an end of conversion signal from the ADC 14, for example. Instantaneous amplitude calculation means 21 forms suitable pairs of data $\hat{x}[n]$ and $\hat{x}[m]$ from an array of digital waveform read, determines a sum of squares in accordance with the equation (5), and also forms a square root of the sum of the square., to calculate an instantaneous amplitude $|\hat{z}[n]|$.

The array of instantaneous amplitudes is applied as an input to interleaver means 20, which then operates to form an interleaved signal from the amplitude A of the sine wave and the array of instantaneous amplitudes. The interleaved signal is supplied as an input to digital moving differentiator means 22, which then operates to calculate a moving difference between a current input value and an immediately preceding input value. Since the input interleaved signal is arranged in the sequence of $(A, |\hat{z}[1]|, A, |\hat{z}[2]|, \ldots, A, |\hat{z}[n]|, \ldots)$, it will be noted that a difference having a same absolute magnitude $|A-|\hat{z}[n]||$ is delivered twice in succession.

Accordingly, the digital moving differentiator means 22 is designed to deliver one output every two samples, thus delivering the difference having an absolute amplitude of $|A-|z[n]||$ only once. In sum, the instantaneous amplitude comprising M samples is input to the interleaver means 20, the output of which is processed by the digital moving differentiator means 22 to provide a number of output samples which are equal to M. Maximum (or peak) detecting means 23 receives the array of difference signals as input, and operates to detect and deliver a maximum amplitude. A logarithm of the detected maximum amplitude is formed and is substituted into the equation (8.2) as a dB value, thereby allowing an instantaneous effective number of bits B to be estimated.

The array of instantaneous amplitudes is also supplied to a digital moving differentiator means 22', which sequentially delivers $||z(1)|-|z(2)||$, $||z(2)|-|z(3)||$, $||z(3)|-|z(4)||$. . . in response to the input comprising $|z(1)|$, $|z(2)|$, $|z(3)|$. . . . A maximum value among the outputs is detected by peak detecting means 237 and is substituted into the equation (7.2), allowing instantaneous DNL to be estimated.

Embodiment 2

Figure 14B:
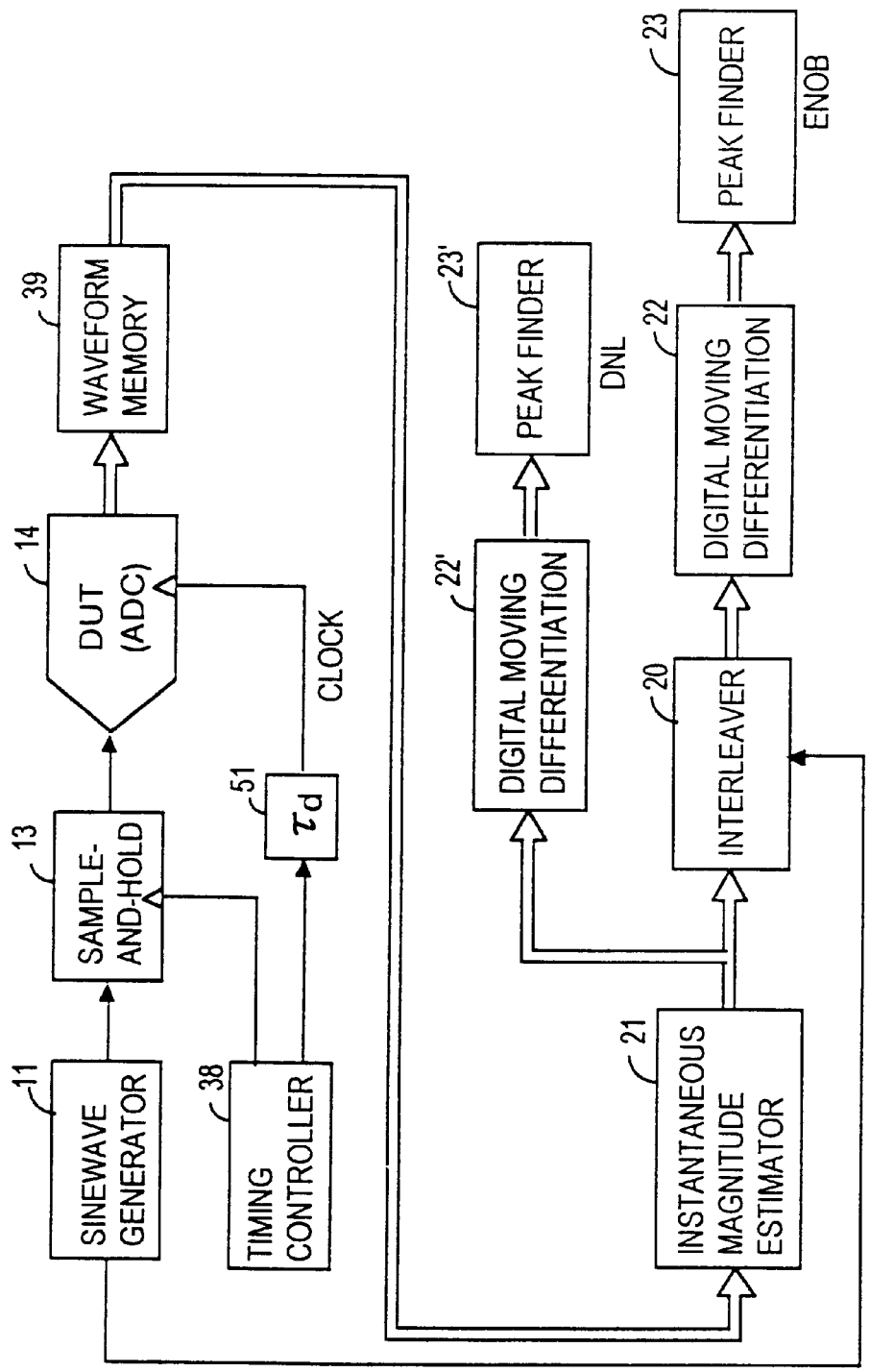

FIG. 14B shows an embodiment which estimates; an effective number of bits and DNL of an ADC which does not internally contains a sample-and-hold circuit. A sine wave from an analog signal generator 11 is retained in a sample-and-hold circuit 13 for a clock interval which is supplied from a clock generator 38 before it is applied to an ADC 14 under test. A waveform memory RAM 39 accumulates digital signals from the ADC 14. The conversion operation by the ADC 14 is delayed by a delay element 51 responding to a clock so that the conversion takes place under a stabilized condition of the sample-hold-circuit 13. In other respects, the arrangement is similar to that shown in FIG. 14A.

As indicated in broken lines in FIG. 14A, a low pass filter 12 may be provided to eliminate distortion components from the sine wave generated by the signal generator 11 before it is applied to the ADC which internally houses a sample-and-hold circuit. Also in FIG. 14B, a similar low pass filter 12 may be provided on the output side of the signal generator 11 in FIG. 14B in order to eliminate distortion components.

Embodiment 3

Figure 15:
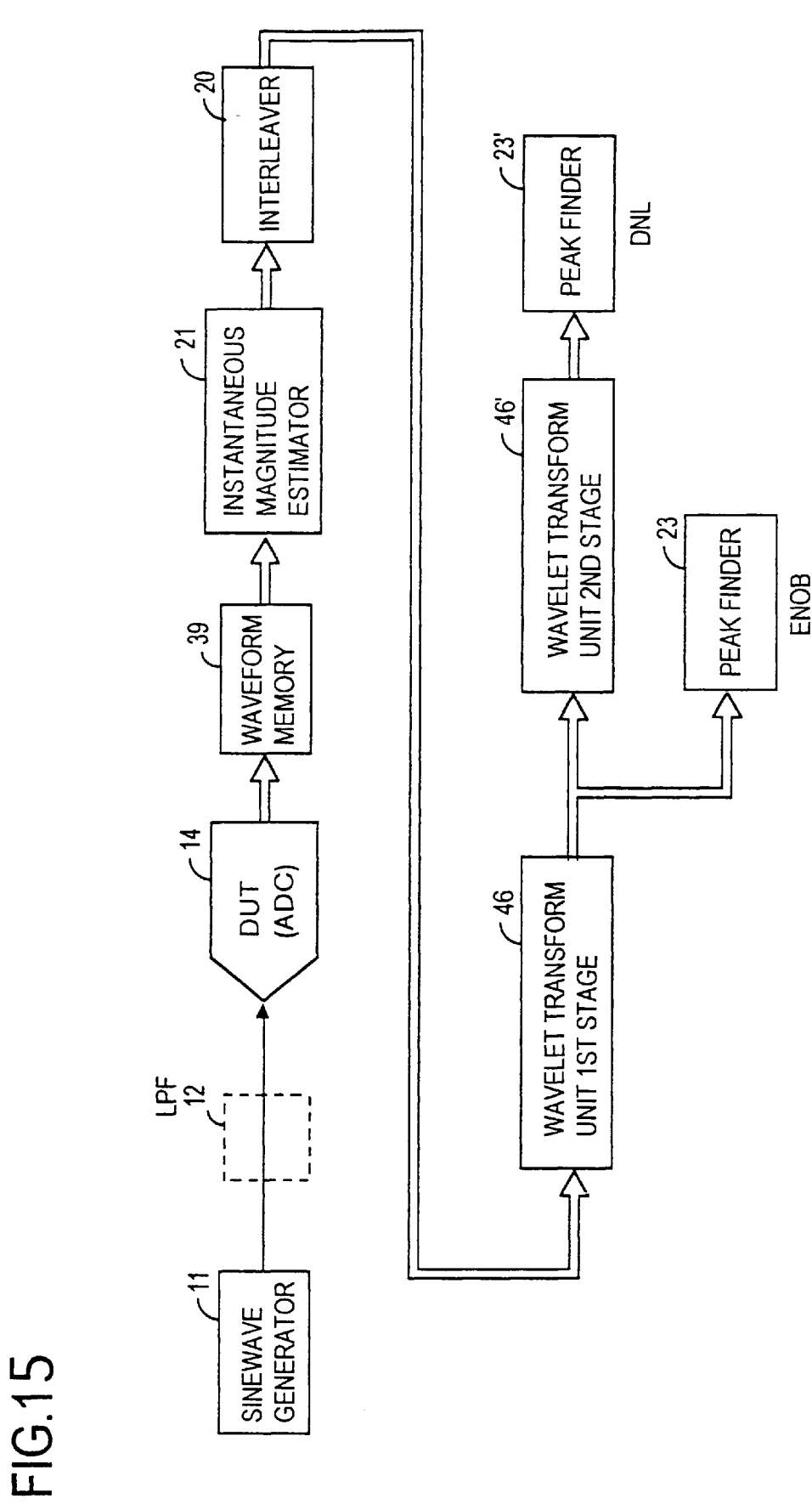
FIG. 15 is a schematic view showing the functional arrangement of a system according to the invention which uses wavelet transform means.

FIG. 15 shows an example of using wavelet transform means, using reference numerals as used before for parts which corresponds to those shown in FIG. 14. It is to be noted that in an arrangement of FIG. 15, it is assumed that an ADC 14 internally houses a sample-hold-circuit. Interleaved signal from interleaver means 20 is subject to the transform in the first stage 46 of the wavelet transform means, and a maximum value among the transforms or the dynamic range DR of the ADC is detected by the peak detecting means 23. The value of the DR is substituted into the equation (8.2) to allow an instantaneous effective number of bits to be estimated.

Transform outputs of the first stage 46 of the wavelet transform means or its components which are passed through the low pass filter is input to the second stage 46' of the wavelet transform means where it is oversampled and is then subject to the high pass filtering in the second stage of the wavelet transform means. A maximum value among the results of such processing operation is detected by peak detecting means 23' and is then substituted into the equation (9.1) to allow an instantaneous DNL to be estimated.

Where the wavelet transform is thus used, a modification as shown in FIG. 14B may be applied for an ADC which does not internally house a sample-and-hold circuit.

Embodiment 4

Figure 6A:
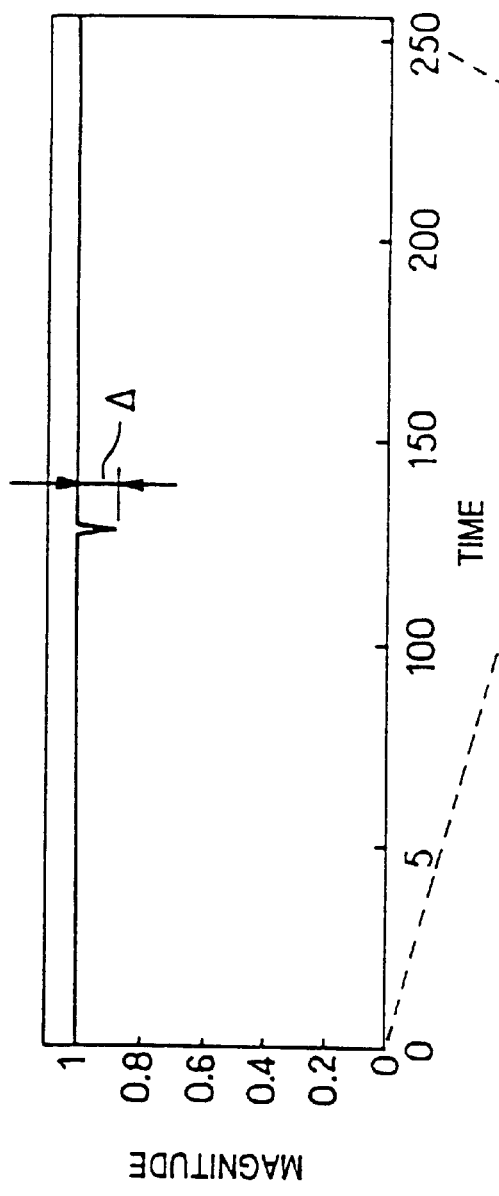
FIGS. 6A–B graphically shows the single pulse signal and a result of wavelet transform (using Haar base) thereof.
Figure 6B:
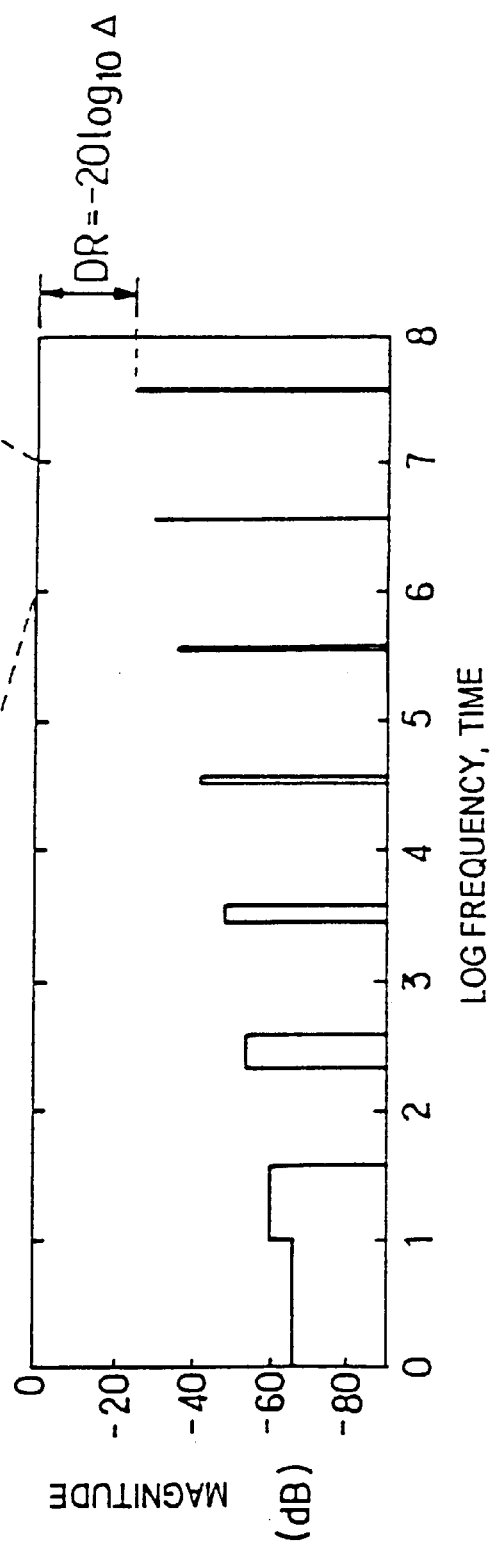
Figure 7:
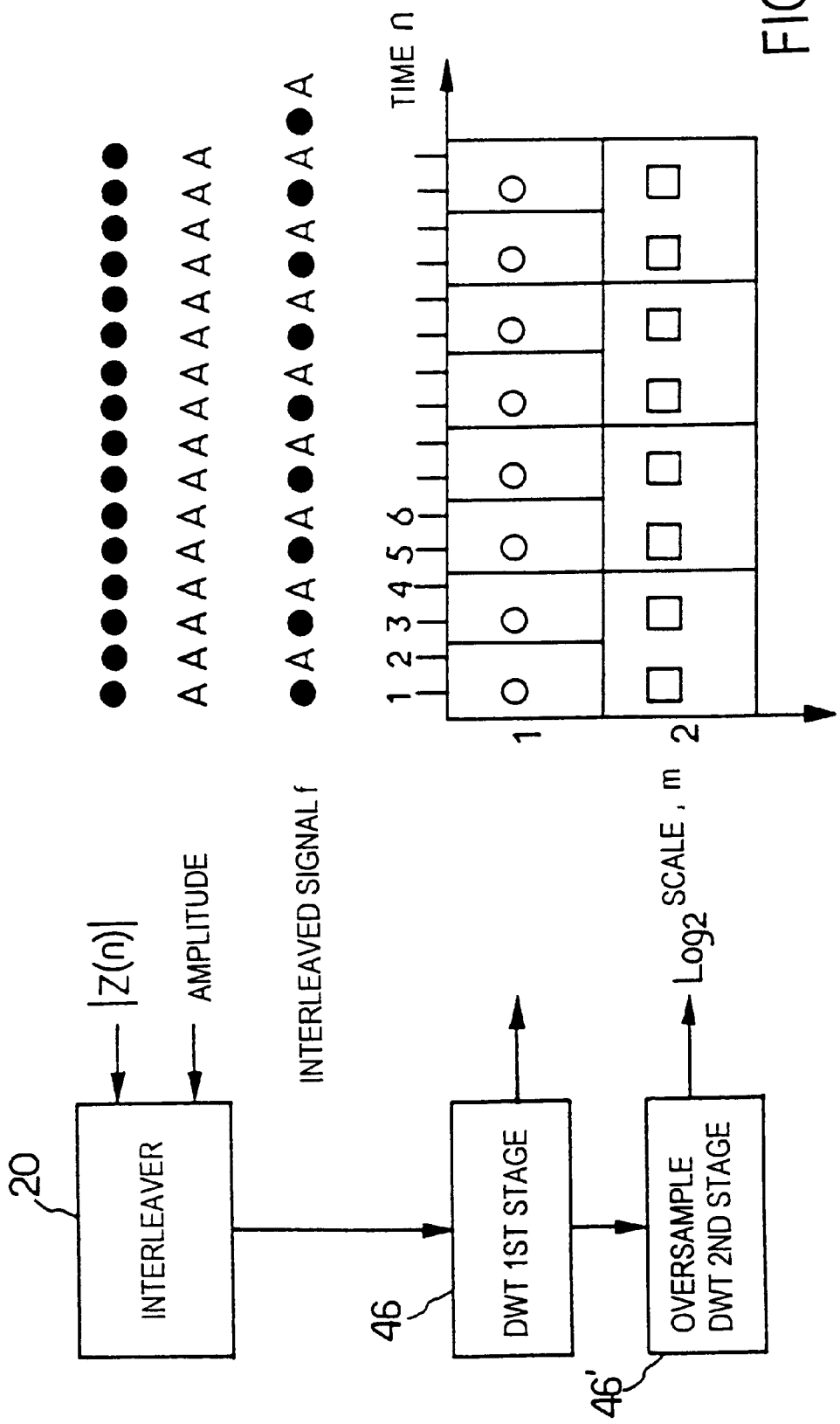
FIG. 7 is a schematic illustration of the interleaving operation and respective operations occurring in the first stage of the wavelet transform and the oversampling second stage of the wavelet transform.
Figure 8A:
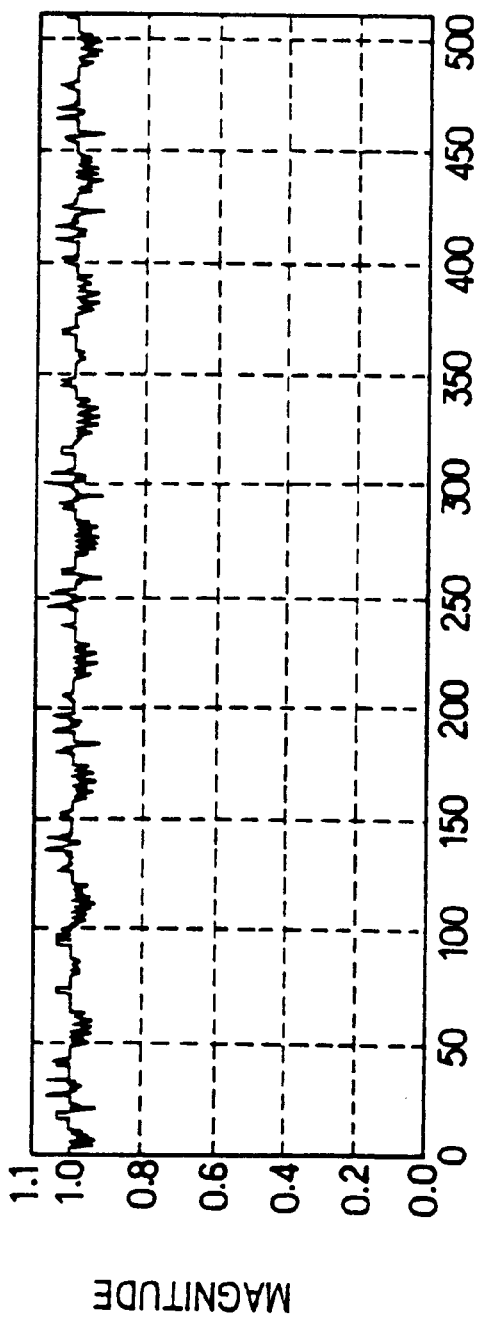
FIG. 8A graphically shows the interleaved signal.
Figure 8B:
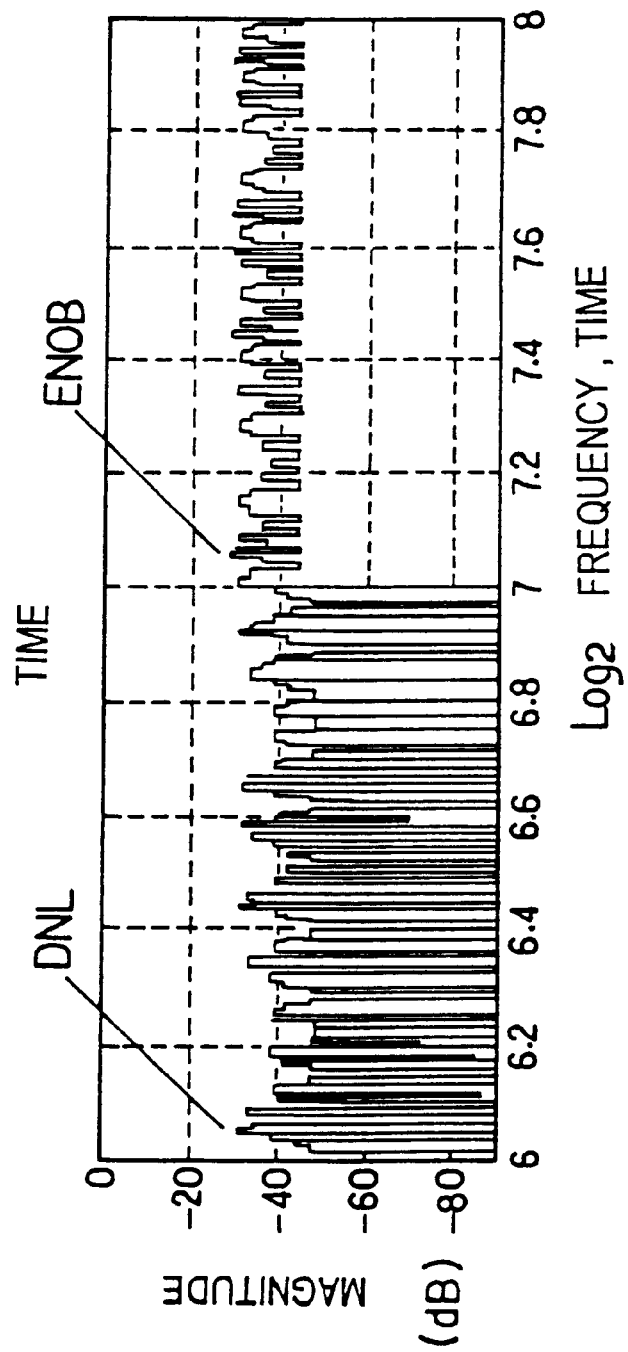
FIG. 8B graphically shows an exemplary estimation of an effective number of bits (ENOB) and the differential non-linearity DNL according to the wavelet transform.
Figure 9A:
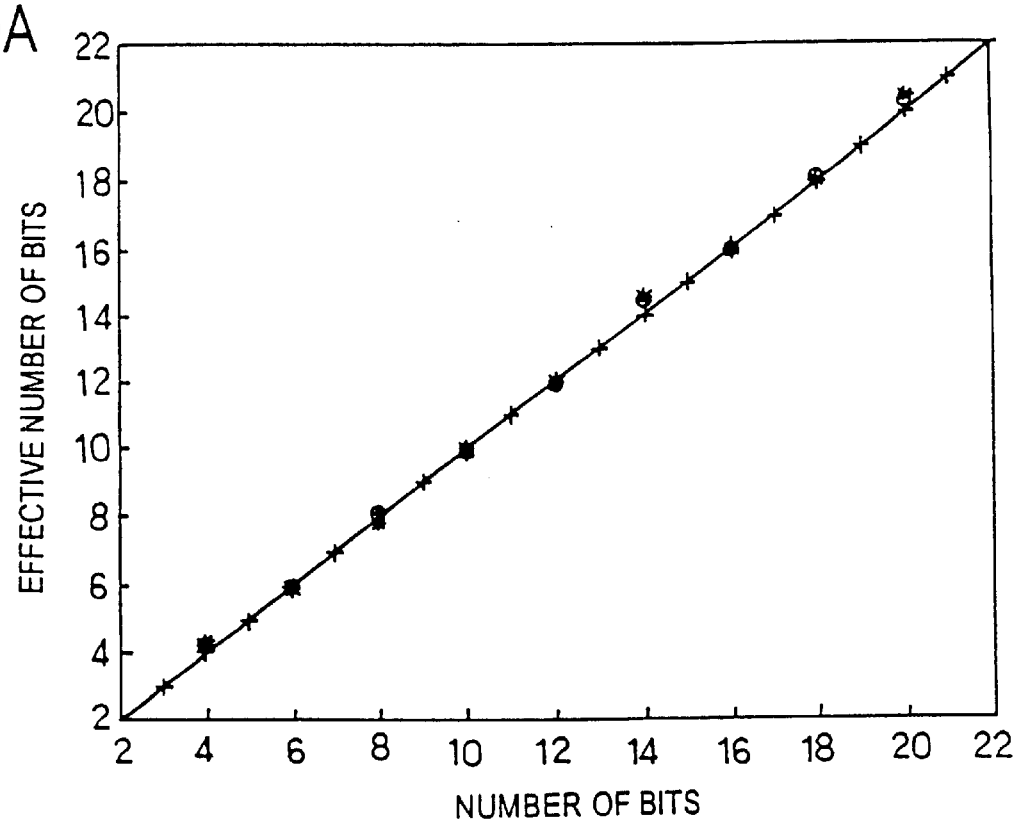
FIG. 9A shows a result of wavelet transform (using Haar base) applied to the instantaneous amplitude which is estimated from the output from the 4-bit ADC.
Figure 9B:
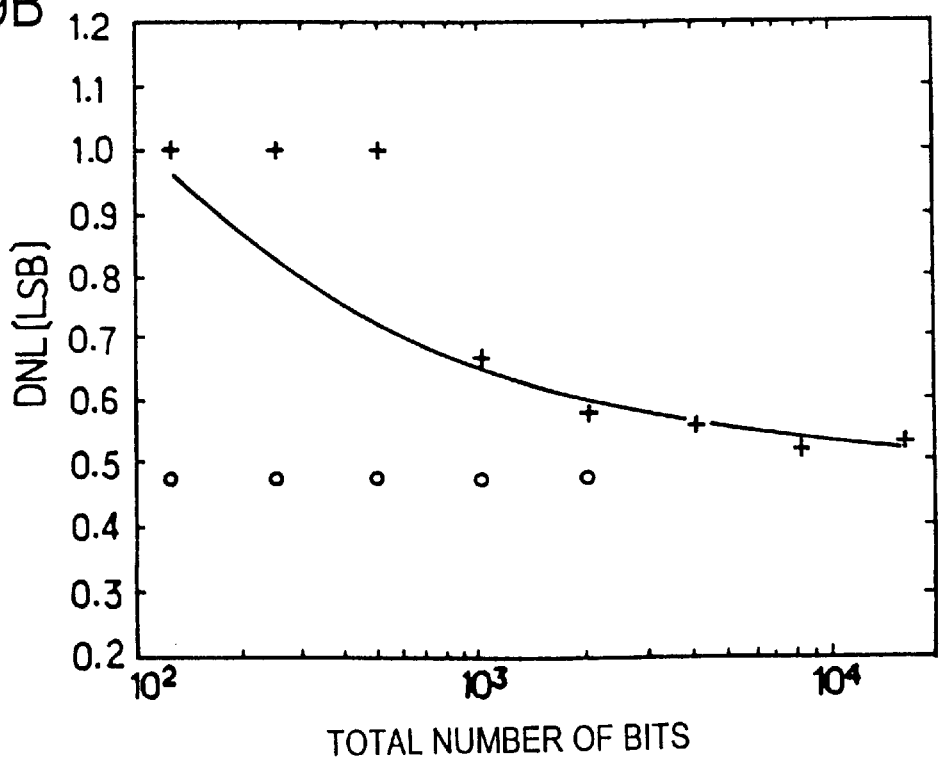
FIG. 9B graphically compares a relationship between the number of samples and the DNL between the conventional method and the method according to the invention.

FIG. 6 shows an arrangement around the waveform memory in the system of the invention in detail. A sine wave from an analog signal generator 11 is applied to an ADC 14 under test, and a waveform memory 39 accumulates a digital signal from the ADC 14.

A: signal capture through trigger

The analog signal generator 11 also generates a trigger signal, which starts a remaining sample counter 42 which is preset to a number of remaining samples L. Each time a new sample is received, the count in the counter 42 is decremented by one. When the count in the counter 42 becomes equal to zero, a switch 43 which is coupled to the waveform memory 39 is turned off to terminate the write-in of the digital signal to the wave form memory 39.

B: signal capture through internal timing

The CPU 38 shown in FIG. 11 or 12, or the control computer 48 shown in FIG. 13 executes a command selected by a user or a commands from a file which is read from the disc, together with an associated sub-system. When a command "hold an input signal" is given, the CPU or the control computer turns the switch 43 which is coupled to the waveform memory 39 off, thus terminating the write-in of the digital signal into the waveform memory 49.

In each instance, a read-out of the digital waveform from the waveform memory 39 takes place as follows: It is initially assumed that the waveform memory 39 has a size of 1024, meaning that memory addresses are from 0 to 1023. If a last write-in address to the waveform memory 39 were 500 (of 1023), the last write-in address may be read out from the address generator 44 and incremented by one to provide an address of 501. An oldest sample is stored at this address. Thus, samples can be sequentially read out beginning with the oldest sample, by reading out the last write-in memory 39 from the address generator 44 and incrementing it by one.

Means 53 for calculating "a number of offset samples between waveform memories which store digital waveforms having a phase difference of 90° therebetween", which correspond to the cosine wave and the sine wave, is given the frequency $f_0$ of the sine wave and the sampling frequency fs of the ADC 14 to calculate "a number of offset samples k within the waveform memory 39 which stores the digital waveforms having a phase difference of 90° therebetween".

$$k=[fs/(4f_0)] \tag{10}$$

where [y] represents a maximum integer equal to or less than y. Instantaneous amplitude calculation means 21 takes digital waveforms for (M+k) samples from the waveform memory 39 where DA represents "a number of samples chosen for estimation for the effective number of bits" and k "a number of offset samples" which is determined by the number of offset samples calculation means 53. The instantaneous amplitude calculation means 21 then forms pairs of $\hat{x}[0]$ and $\hat{x}[k]$, $\hat{x}[1]$ and $\hat{x}[k+1]$, . . . , $\hat{x}[M]$ and $\hat{x}[M+k]$ in the array of digital waveforms, which are taken by incrementing one for remainder calculation, and forms a sum of squares and then forms a square root of the sum of squares to calculate the instantaneous amplitude $|z[n]|$ in accordance with the equation (5).

The array of instantaneous amplitudes is supplied to the interleaver means 20 as an input, which then produces an interleaved signal using the amplitude A of the sine wave and the array of instantaneous amplitudes.

The interleaved signal produced by the interleaver means 20 is input to digital moving differentiator means 22, which then calculates the moving differences from the interleaved signal. Peak detecting means 23 then receives the array of the difference signals and detects and delivers a maximum amplitude. A logarithm of the detected maximum amplitude is formed and is substituted to the equation (8.2), thus allowing the instantaneous effective number of bits B to be estimated Alternatively, the instantaneous amplitudes |ẑ[n]| which is determined by the instantaneous amplitude calculation means 21 may be input to the digital moving differentiator means 22 in the time sequence, and its moving difference over an immediately preceding instantaneous amplitude |ẑ[n−1]| may be calculated. The maximum detecting means 23 receives the moving differences, compares the moving differences against the maximum value which is stored therein up to that point, stores and delivers a greater one of them as a maximum amplitude. When a logarithm of the detected maximum amplitude is formed, it may be substituted into the equation (8.2) to estimate the instantaneous effective number of bits B. Again, as, indicated in parentheses, the moving differentiator means 22 may be replaced by wavelet transform unit 46. In this instance, M represents a number of wavelet transformed samples. The array of instantaneous amplitudes may be input to the digital moving differentiator means 22', and the resulting moving differences may be input to the peak detecting means 23', and a detected maximum value may be substituted into the equation (9.1) to estimate an instantaneous DNL.

The interleaved signal may be input to the wavelet transform means 46, and the output from the first stage thereof may be input to peak detecting means 23, allowing an instantaneous effective number of bits B to be estimated from the detected peak value. The output from the first stage of the wavelet transform may be input to the second stage of the wavelet transform where it is oversampled to apply the second stage processing of the wavelet transform, and a peak of the transform outputs may be detected, thus allowing an instantaneous DNL to be estimated from this peak value.

Figure 16:
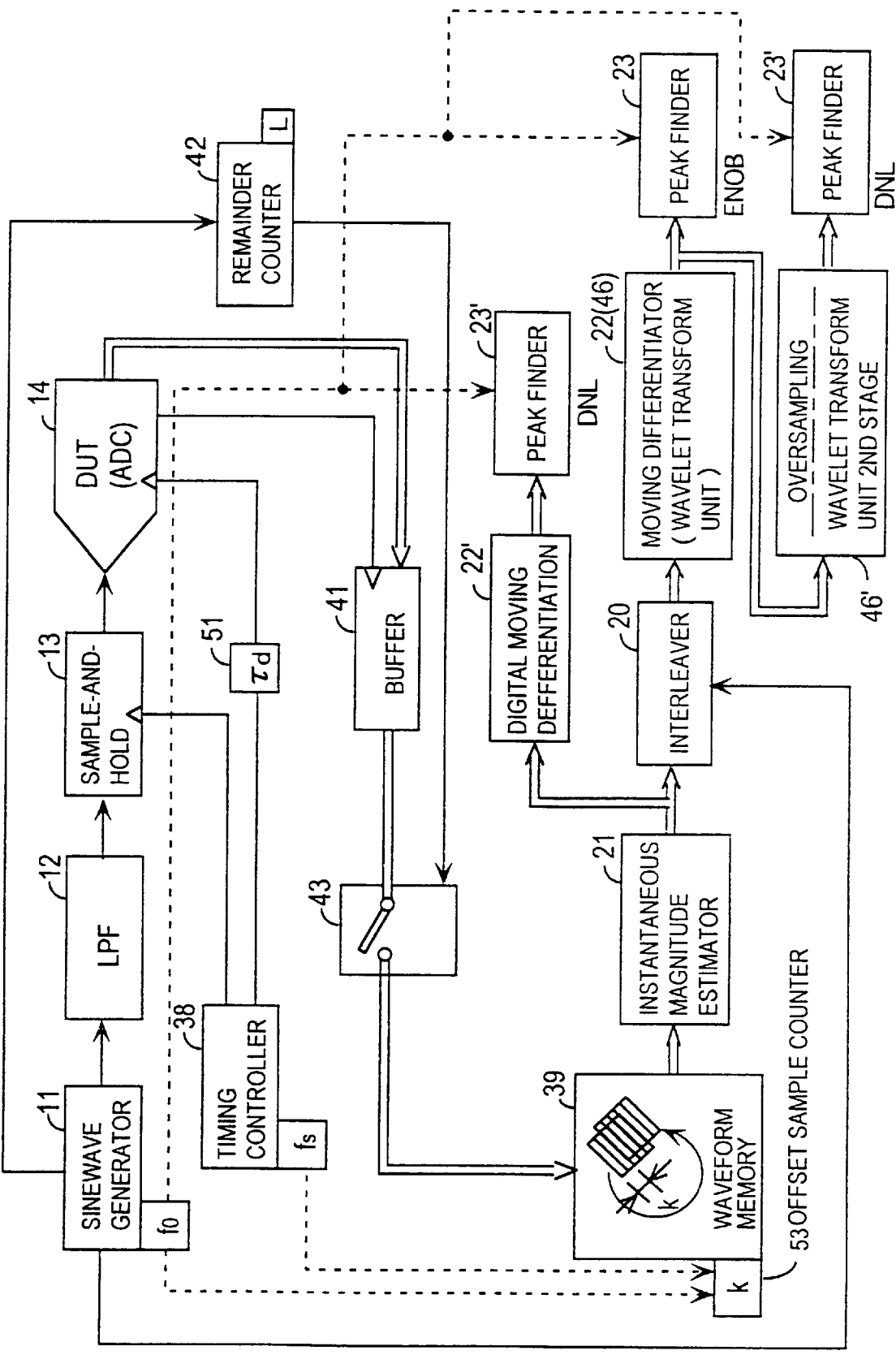
FIG. 16 is a schematic view showing the functional arrangement of part of a system according to the invention in detail which is located around its memory.

Normally, the processing operation takes place by using a computer as illustrated in FIGS. 11 to 13, and accordingly, three peak detecting means shown in FIG. 16 share a common peak detecting function. A processing operation which occurs subsequent to the processing operation in the instantaneous amplitude calculation means 21 remains the same in subsequent embodiments and therefore will not be specifically described.

Embodiment 5

Figure 17:
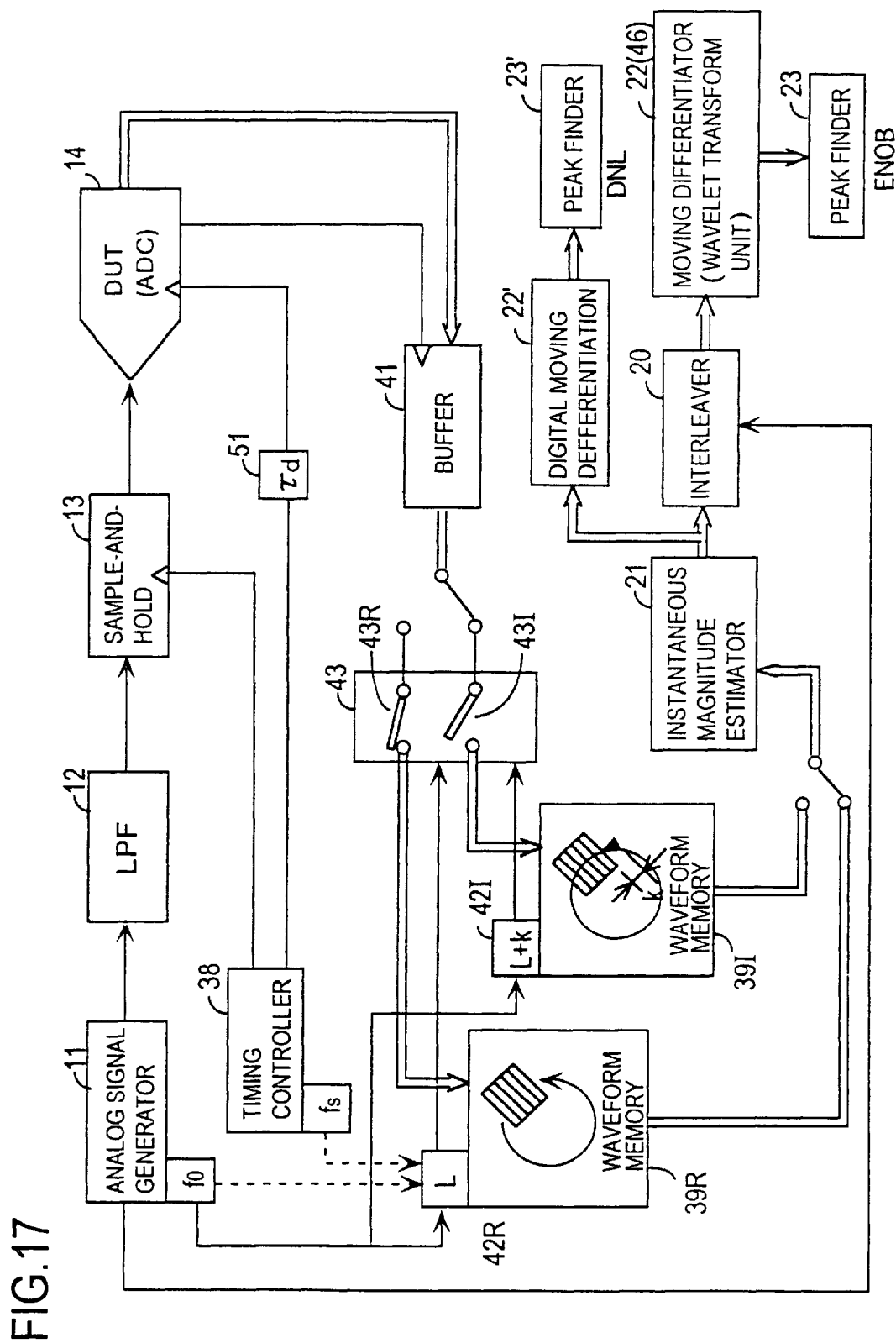
FIG. 17 is a schematic view showing another functional arrangement around the memory in the system according to the invention.

FIG. 17 shows an arrangement around a waveform memory 39 in the system of the invention in detail. It is assumed that a real part waveform memory 39R has a remaining sample counter 42R associated therewith in which a number of remaining samples L is preset. Means for calculating "a number of offset samples in a digital waveform having a difference of 90° therebetween", which correspond to the cosine wave and the sine wave, is supplied with the frequency $f_0$ of the sine wave and the sampling frequency fs of the ADC to calculate "a number of offset samples k in the digital waveform having a phase difference of 90° therebetween" according to the equation (10). An imaginary part waveform memory 39I has a remaining sample counter 42I associated therewith which is preset to L+k. It is assumed that a selection switch 43 associated with the waveform memory 39 now selects the real part waveform memory 39R. A signal generator 11 which generates an analog signal generates a cosine wave, which is applied to an ADC 14 under test. The real part waveform memory 39R accumulates a digital signal from the ADC 14. A trigger signal generated by the analog signal generator 11 starts the remaining sample counters 42R, 42I, and when the count in the remaining sample counter 42R becomes equal to zero, for example, a switch 43R coupled to the real part waveform memory 39R is turned off, terminating the write-in of the digital signal into the real part digital memory 39R, followed by a selection of the imaginary part waveform memory 39I by a selection switch 43I associated therewith. The signal generator 11 which generates an analog signal generates a cosine wave, which is then applied to the ADC 14 under test. The imaginary part waveform memory 39I accumulates a digital signal from the ADC 14. As before, a trigger signal generated by the analog signal generator 11 starts the remaining sample counter 42I, and when the count in the remaining sample counter 42I becomes equal to zero, for example, the switch 43I coupled to the imaginary part waveform memory 39I is turned off, terminating the write-in of the digital signal into the imaginary part waveform memory 39I. Sine waves corresponding to the imaginary part are stored in the waveform memory 39I for a number of offset samples k.

Instantaneous amplitude calculation means 21 lakes digital waveforms for M samples from each of the real part waveform memory 39R and the imaginary part waveform memory 39I where M represents "a number of samples selected to estimate the effective number of bits". Then, taking pairs of x̂.re[0] and x̂.im[0], x̂.re[1] and x̂.im[1], ... , x̂.re[M] and x̂.im[M] from the array of digital waveforms, each of which is taken by incrementing by one for the remainder calculation, the instantaneous amplitude calculation means 21 form a sum of squares and then calculates a square root of the sum of squares to determine an array of instantaneous amplitudes.

$$|z[n]| = \sqrt{(\hat{x}.re[n]^2 + \hat{x}.im[n]^2)} \qquad (11)$$

The array of instantaneous amplitudes is supplied to interleaver means 20 as an input. In other respects, the arrangement and function remain the same as mentioned above in connection with FIG. 16, and therefor will not be specifically described.

Figure 18:
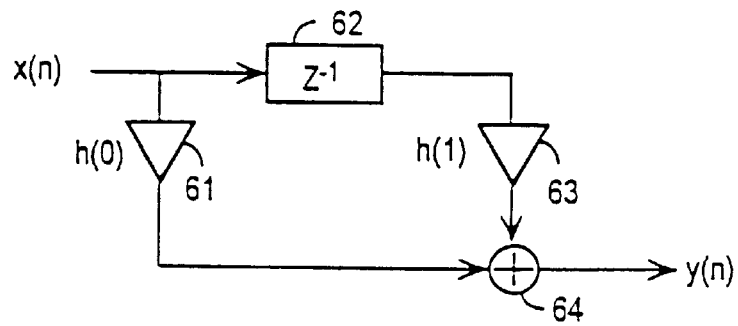
FIG. 18 is a schematic view showing a specific example of digital moving differentiator means.

FIG. 18 shows a specific example of digital moving differentiator means 22, which is non-cyclic filter represented by the following equation:

$$y(n)=h(N)x(n-N)+h(N-1)x(n-N+1)+ \ldots + h(1)x(n-1)+h(0)x(n) \qquad (12.1)$$

where it may be assumed that h(0)=½, h(1)=−½ and other filter coefficients are h(2)= ... =h(N)=0, whereupon the filter represents a difference filter represented as follows:

$$y(n)=-(½)x(n-1)+(½)x(n) \qquad (12.2)$$

Thus, x(n) is supplied to a multiplier 61 and a one sample period delay element 62 and an output from the delay element 62 is supplied to a multiplier 63. The multipliers 61 and 63 multiply respective input by a factor of h(0)=½ and h(1)=−½, respectively, and their multiplication results are added together in an adder 64 to provide an output y(n). In this manner, an output signal represents a difference between the current value x(n) and an immediately preceding value x(n−1) of the input signal. A procedure to determine optimum filter coefficients is described in "Discrete-Time Signal Processing", by Alan V. Oppenheim, Ronald W. Schafer, Prentice-Hall, 1989, in particular, 7.5.2 Discrete-Time Differentiators. The difference filter may be implemented in either a digital filter shown in FIG. 18 or a digital moving differentiator which is used to perform a calculation according to the equation (12.2).

A method of observing a time distribution of lo(cal maxima in the instantaneous effective number of bits will now be considered. When M samples are input to digital moving differentiator means, (M−1) differences are delivered as outputs. Accordingly, the period of the difference output corresponds to the period of the input. By using the frequency $f_0$ of the sine wave and the sampling frequency fs of the ADC as inputs, "a number of samples p per period" is calculated.

$$p=[f_s/f_0] \tag{13}$$

The "number of samples p per period" is used as a control input to a peak detector or finder. When p difference samples each having an absolute magnitude are supplied, a processing operation takes place which comprises (a) forming a logarithm of the absolute magnitude of only local maxima and using it to deliver an instantaneous effective number of bits B according to the equation (8.2), and (b) delivering zeros for the remaining (p−1) data. By this processing operation, it is possible to observe an instantaneous effective number of bits at a local maximum as a function of time.

Figure 19:
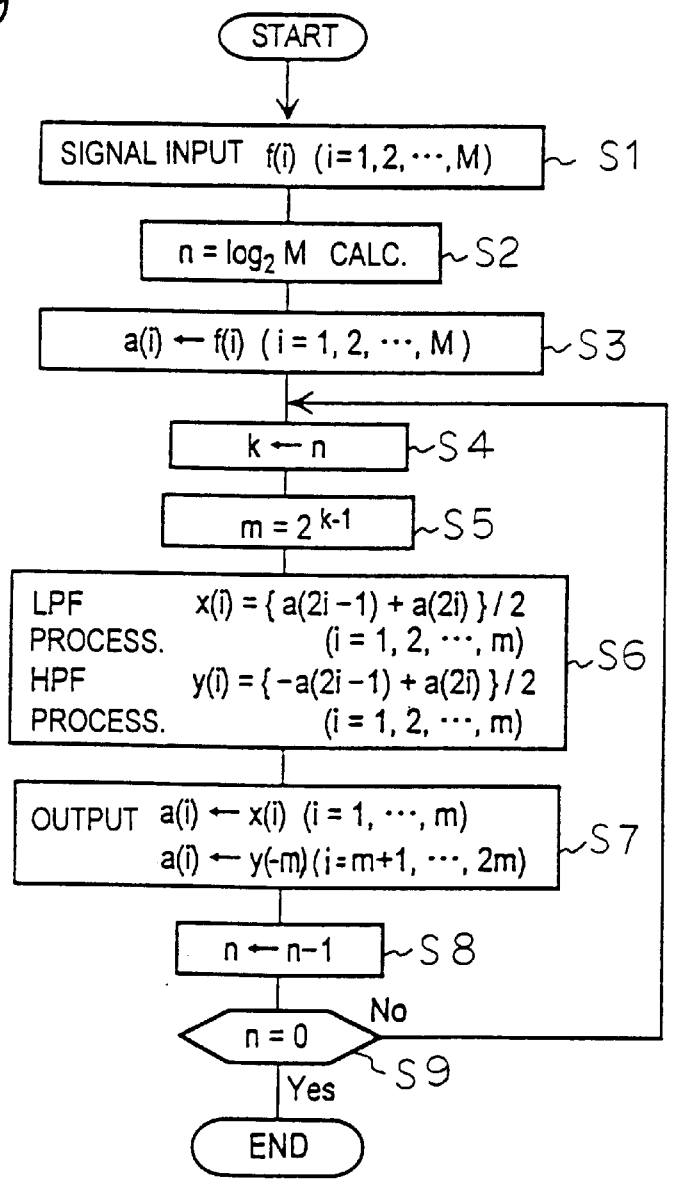
FIG. 19 is flow chart illustrating the operation of Haar-Wavelet transform means.

FIG. 19 shows a sequence of operations which take place within the wavelet transform unit 46 where Haar base function is used. In addition, a normalization factor of ½ is used here, but may be 1/√2 as is commonly used. M input signals f(i), (i=1, 2, . . . , M) are used to calculate n=log$_2$M (S2), thus copying input signals f(i) to a(i) which corresponds to interim results and output signals (S3). k is changed to be n, n−1, . . . , 2, 1, (S4, S8, S9), and for m=2$^{k-1}$ (S5), a low pass filtering takes place by the calculation of x(i)={a(2i−1)+a(2i)}/2(i=1, 2, . . . , m) and a high pass filtering is executed to calculate y(i)={−a(2i−1)+a(2i)}/2 (i=1, 2, . . . , m) (S6). The result of such calculation is copied to the interim result a(i) (S7). a(i)=x(i), for i=1, 2, . . . , m, and a(i)=y(i), for i=m+1, . . . , 2m, are delivered as outputs. (S7). The processing which takes place at k=n represents the first stage of transform, and the result is used in estimating an instantaneous effective number of bits. It is also oversampled to perform a processing operation for k=n−1 or second stage of transform for use in the estimation of an instantaneous DNL. In this instance, only the low pass filtering may be applied for the output from the first stage while the only the high pass filtering may be applied for the second stage.

Figure 20:
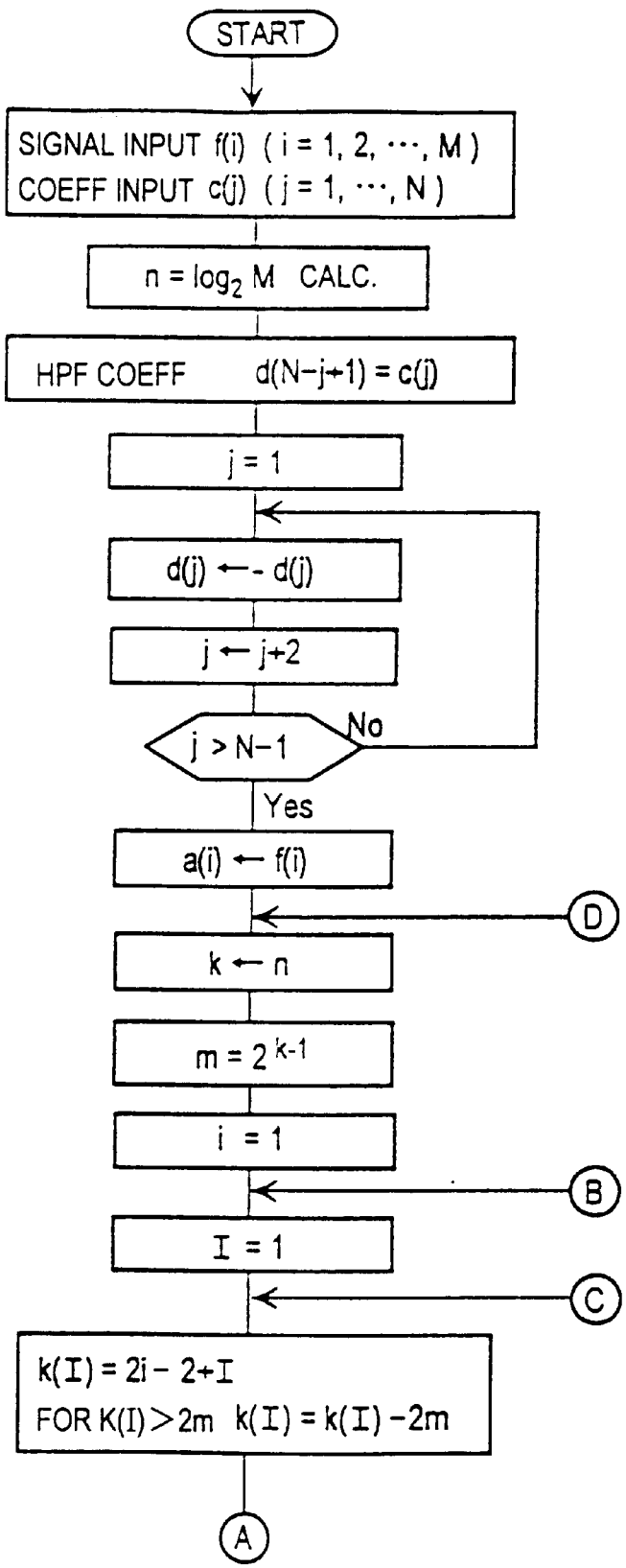
FIG. 20 is a flow chart showing a part of the operation of Daubechies-Wavelet transform means.
Figure 21:
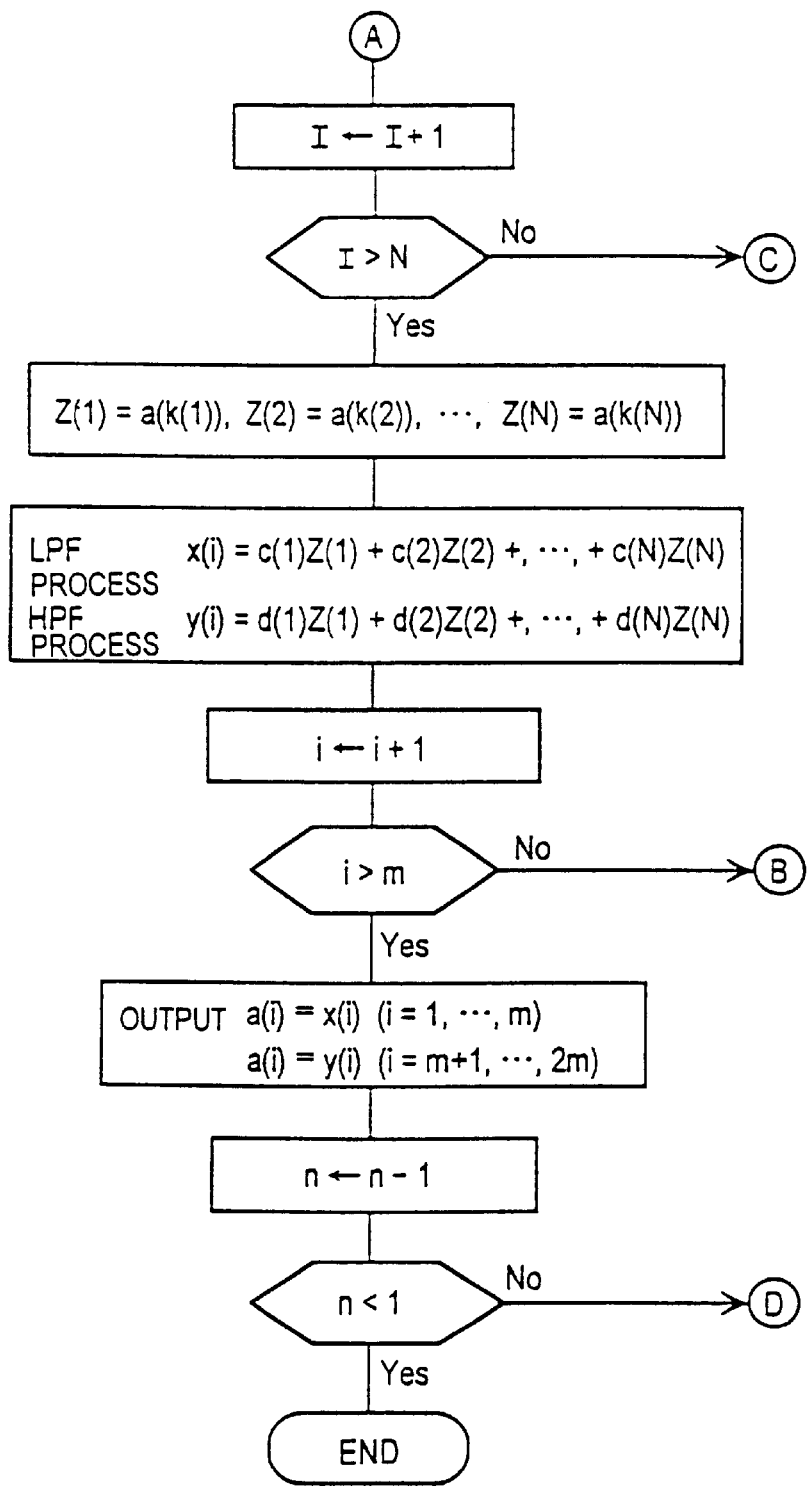
FIG. 21 is a flow chart which continues to the operation shown in FIG. 20.

FIGS. 20 and 21 show a flow of processing in the wavelet transform means when using base functions such as Daubechies. In these flow charts, a scale corresponding to a period or "k" in 2$^{k-1}$ is treated as "level k". The algorithm of the wavelet transform is described in detail in "Wavelets and Subband Coding", by Mathin Vetterli, Jelena Kovacevic, Prentice-Hall, 1995. The implementation of the wavelet transform in VLSI is; reported in "VSLI Implementation of Discrete Wavelet Transform", by Aleksander Grezeszczak, Mrinal K. Mandal, Sethuraman Panchanathan, Tet Year), IEEE Trans. Very Large Scale Integration (VLSI) System, Vol. 4, No. 4, 1996. Accordingly, the wavelet transform means may comprise the wavelet transform means shown in FIGS. 19, 20 and 21 or wavelet transform unit implemented VLSI. In this instance, the processing operation which takes place for k=n represents the first stage of transform, and the processing operation for k=n−1 represents the second stage of transform, the latter involving an oversampling.

The oversampling Haar wavelet transform means may be implemented as follows: A low pass filter in the Haar-Wavelet transform has coefficients (½, ½), and a high pass filter has coefficients (−½, ½). Thus, the number of filter coefficients is equal to two. In this instance, a filtering takes place in dyadic translation of the base function along the time axis, as shown in FIG. 19. For a(1), a(2); a(3), a(4); . . . ; a(N−1), a(N), there is no overlap between signals which are being filtered such as between {a(1), a(2)} and {a(3), a(4)} because the number of filter coefficients for the Haar-Wavelet transform is equal to the number of dyadic translation. As a consequence, "a change in the signal having a quantization step width Δ between an even-numbered and an odd-numbered sample" cannot be detected in the Haar wavelet transform. Accordingly, in order to use the Haar wavelet transform, it is necessary to produce a cyclic shift of the input signal {a(1), a(2), a(3), a(4), . . . , a(N−1), a(N)}, namely, {a(N), a(1), a(2), a(3), a(4), . . . , a(N−1)} so as to enable "a change in the signal between an even-numbered and an odd-numbered sample" to be detected by the wavelet transform. A procedure therefor will be described. (a) The input signal {a(1), a(2), a(3), a(4), . . . , a(N−1), a(N)} is subject to the Haar wavelet transform, then (b) a cyclic shift version {a(N), a(1), a(2), a(3), a(4), a(N−1)} is produced. (c) The cyclic shift version {a(N), a(1), a(2), a(3), a(4), . . . , a(N−1)} is then subject to the Haar transform. Alternatively, oversampling Haar wavelet transform means may be implemented using the technique disclosed by O. Rioul, "First Algorithm for Continuous Wavelet Transform," Proc. ICASSP 91, pp.2213–2216, 1991.

Figure 22A:
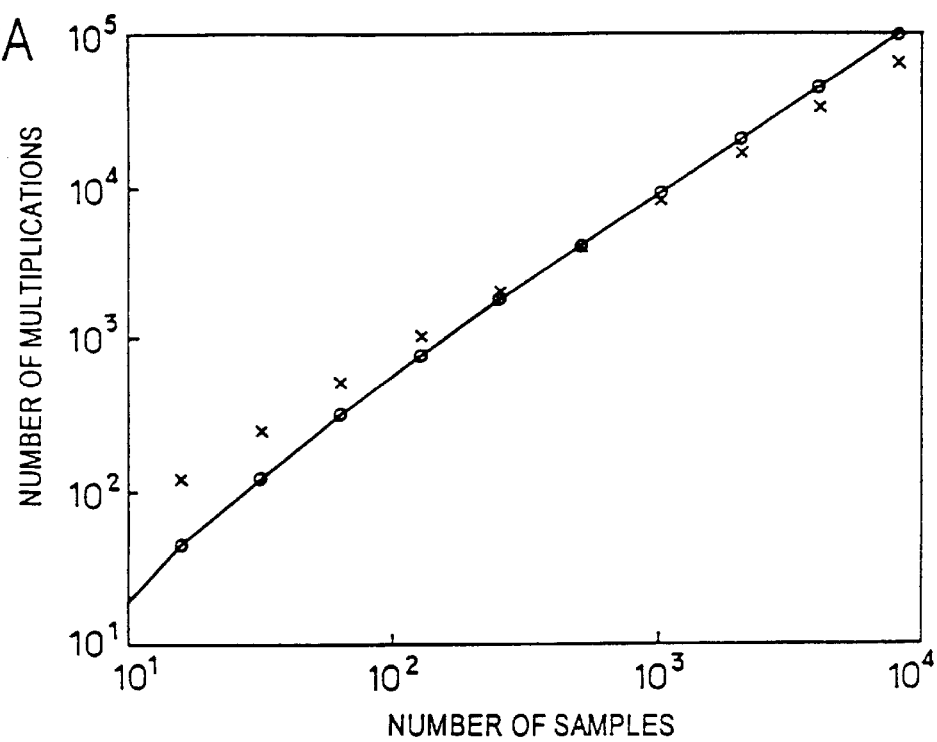
FIG. 22A graphically shows a comparison of the number of real number multiplications between FFT and Daubechies-Wavelet transform.
Figure 22B:
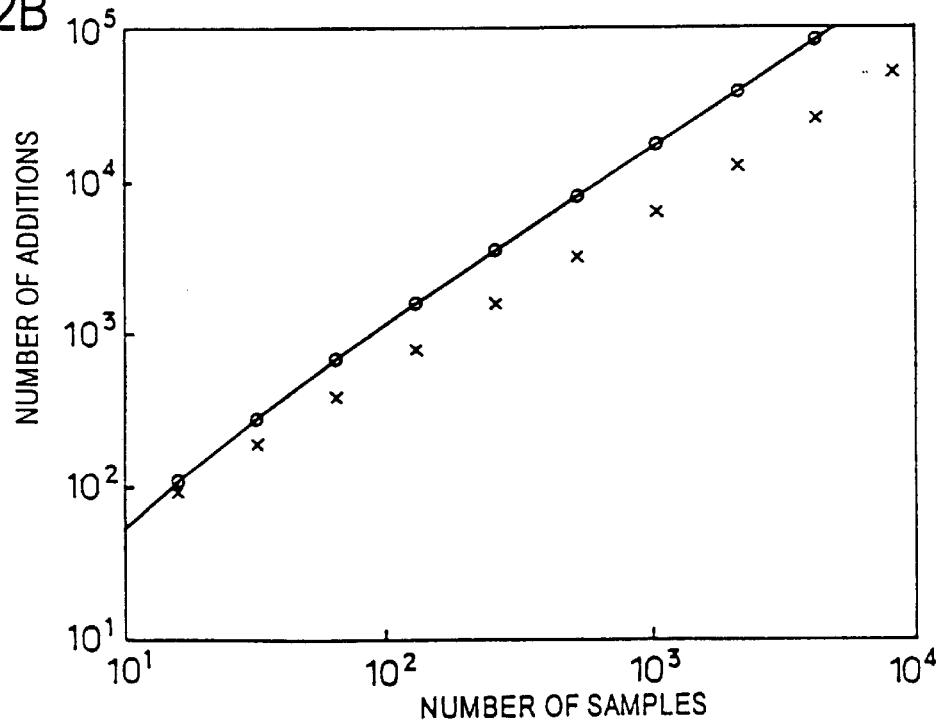
FIG. 22B graphically shows a comparison of the number of real number additions between FFT and Daubechies-Wavelet transform.

FIGS. 22A and B graphically illustrate a comparison of the number of real number multiplications and the number of real number additions between the Daubechies-Wavelet transform and the FFT. A single Daubechies wavelet transform is substantially equivalent in its volume of computation to two Haar wavelet transforms. For a number of sample equal to 512, the number of real number multiplications is substantially equal for the Daubechies wavelet transform and the FFT. At or above a number of samples equal to 1024, the number of real number multiplications for Daubechies-Wavelet transform becomes less than the number of real number multiplication for the FFT. The number of real number additions is less for the Daubechies wavelet transform than for the FFT.

A method of observing a time distribution of local maxima of the instantaneous effective number of bits will be described. When M samples are input to wavelet transform means, M/2 (M/2$^{i+1}$) wavelet transforms are delivered for a maximum (or general) scale level Kmax (Kmax−i). Accordingly, the period of the wavelet transforms corresponds to the period of the input times ½(1+2$^{i+1}$). Supplying the frequency $f_0$ of the sine wave and the sampling frequency $f_s$ of the ADC as inputs, "a number of samples per period $p_i$ for the scale level (Kmax−i)" is calculated.

$$p_i=\tfrac{1}{2}^{i+1}[f_s/f_0] \tag{13}$$

Figure 10A:
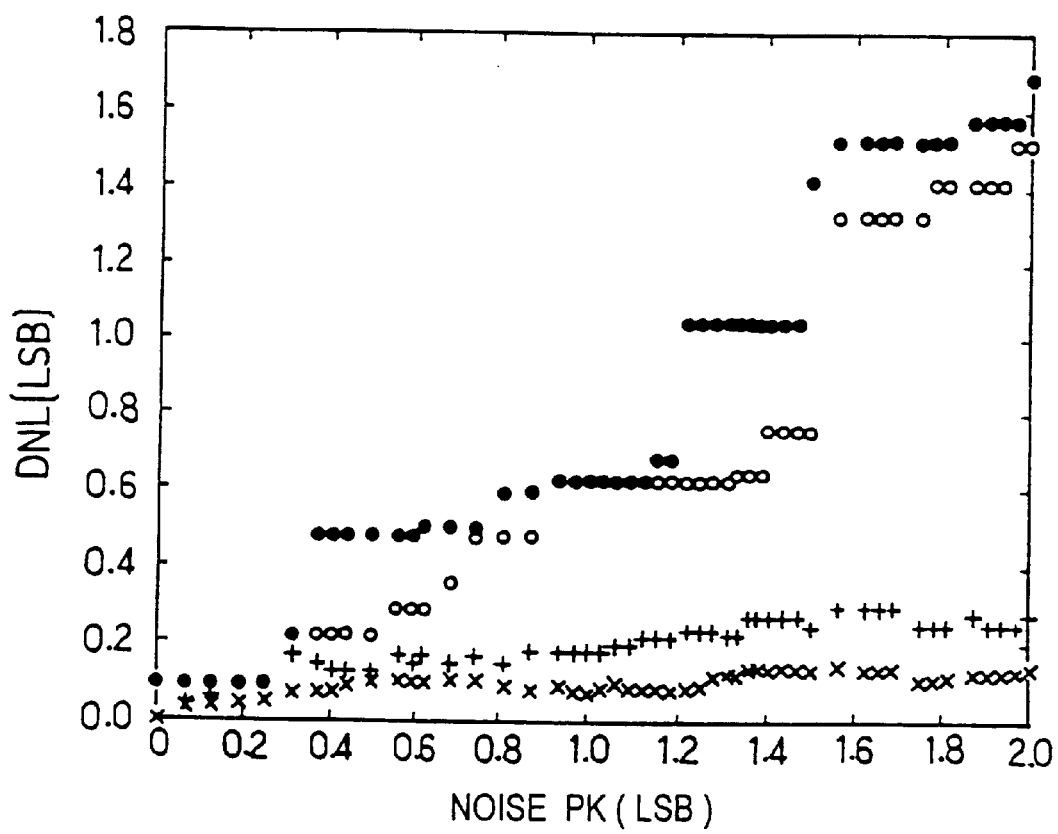
FIG. 10A is a graphical comparative illustration of the evaluation of the DNL for a signal added with a noise between the conventional method and the method according to the invention.
Figure 10B:
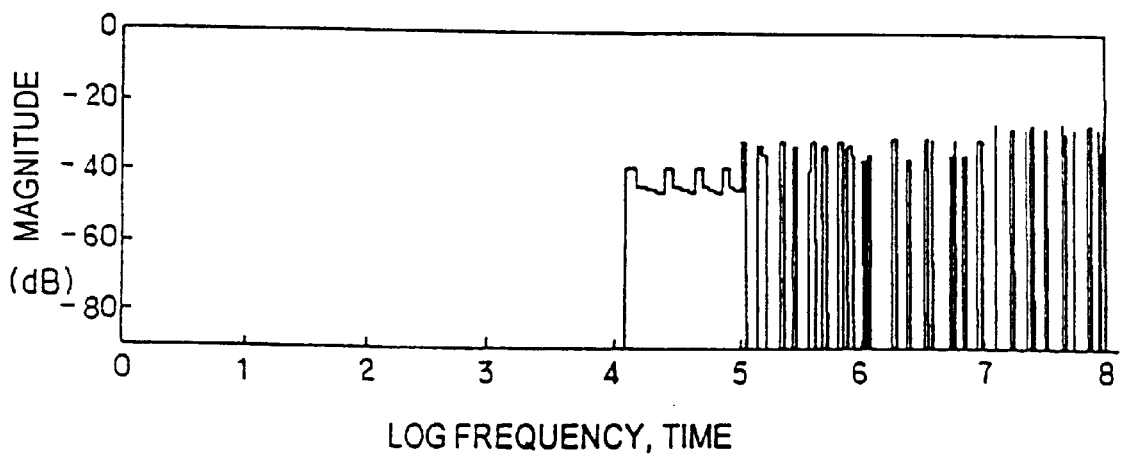
FIG. 10B graphically shows local maxima of the instantaneous DNL plotted against time.

The "number of samples per period $p_i$" is used as a control input to the peak detector 23. If the "$p_i$>1", a local maximum operation takes place. When the absolute magnitudes of $p_i$ wavelet transforms corresponding to the scale level (Kmax−i) are input, a processing operation takes place that (a) a logarithm of the absolute magnitude is formed only for local maxima, and an instantaneous effective number of bits B is estimated and delivered according to the equation (8.2), and (b) zeroes are delivered in place of the remaining ($p_i$−1) data. If "$p_i$<1", zeroes are substituted for the input data to be delivered as outputs. When this processing operation is applied, a local maximum in the instantaneous effective number of bits can be observed as a function of time. FIG. 10B graphically illustrates a result of local maximum processing operation where 256 samples are taken from a sine wave over ten periods.

As mentioned above, according to the invention, an instantaneous effective number of bits and an instantaneous DNL can be estimated with a reduced volume of computation.

What is claimed is:

1. A system for evaluating an analog-to-digital converter comprising:

signal generator for generating an analog signal that is wave-shaped;

a timing controller for generating a clock which is used in feeding the analog signal to an analog-to-digital converter under test;

Hilbert pair resampling means for deriving from an output digital signal from the analog-to-digital converter a digital signal corresponding to a cosine wave and a digital signal corresponding to a sine wave having the period of the analog signal and which are related to each other as Hilbert transform pair;

instantaneous amplitude calculation means for determining an instantaneous amplitude representing both digital signals derived by the Hilbert pair resampling means;

first digital moving differentiator means receiving the instantaneous amplitude as an input and calculating a moving difference signal; and first peak detecting means receiving the moving difference signal as the input and determining a maximum value thereof to estimate the differential non-linearity of the analog-to-digital converter.

2. A system according to claim 1 in which the first digital moving differentiator means comprises absolute magnitude calculation means which determines the absolute magnitude of the moving difference signal.

3. A system according to claim 2 further comprising a period memory for storing the period of the analog signal which is being applied to the analog-to-digital converter, said first peak detecting means for detecting a local maximum in the absolute magnitude of the moving difference signal supplied as the input signal thereto and which corresponds to the period of the analog signal.

4. A system according to claim 1, further comprising interleaver means receiving the instantaneous amplitude and an amplitude of the analog signal as inputs and forming an interleaved signal in which the instantaneous amplitude and the amplitude of the analog signal are interleaved;

second digital moving differentiator means receiving the interleaved signal as an input and calculating a second moving difference signal; and second peak detecting means receiving the second moving difference signal from the second moving differentiator means and determining a maximum value thereof to estimate the effective number of bits of the analog-to-digital converter.

5. A system for evaluating an analog-to-digital converter comprising:

a signal generator for generating an analog signal that is wave-shaped;

a timing controller for generating a clock which is used in feeding the analog signal to an analog-to-digital converter under test;

Hilbert pair resampling means for deriving from an output digital signal from the analog-to-digital converter a digital signal corresponding to a cosine wave and a digital signal corresponding to a sine wave both having the period of the analog signal and which are related to each other as a Hilbert transform pair;

instantaneous amplitude calculation means for determining an instantaneous amplitude representing both digital signals derived by the Hilbert pair resampling means;

interleaver means receiving the instantaneous amplitude and an amplitude of the analog signal as inputs and forming an interleaved signal in which the instantaneous amplitude and the amplitude of the analog signal are interleaved;

first transforming means receiving the interleaved signal as input and applying a wavelet transform to the interleaved signal to supply a first transformed signal as output;

second transforming means receiving the first transformed signal as input and applying a wavelet transform to the first transformed signal to supply a second transformed signal as output;

and first peak detecting means receiving the second transformed signal as input and determining a maximum value thereof to estimate the differential non-linearity of the analog-to-digital converter.

6. A system according to claim 5 further comprising oversampling means to which the output from the first transform means is input and which oversamples it to feed the second transform means.

7. A system according to claim 5, further comprising a period memory for storing a period of the analog signal which is being applied to the analog-to-digital converter, the first peak detecting means being means which detects a maximum value from the output of the second transform means which is input in a manner corresponding to the period of the analog signal.

8. A system according to claim 5 in which the first transform means comprises a low pass filter and the second transform means comprises a high pass filter.

9. A system according to claim 5 further comprising second peak detecting means which receives the output from the first transform means as an input and determines a maximum value thereof to estimate an effective number of bits of the analog-to-digital converter.

10. A system according to one of claim 1, 4, 5, 6 or 9 in which the Hilbert pair resampling means includes a waveform memory which stores the output digital signal from the analog-to-digital converter, the Hilbert pair resampling means comprising means for deriving from a train of digital signals which are read out from the waveform memory the digital signal corresponding to the cosine wave and the digital signal corresponding to the sine wave as two series which are offset from each other by substantially one-quarter the period of the analog signal.

11. A system according to claim 10 in which the waveform memory is a cyclic memory in which as a write-in proceeds to a last address, a write-in then takes place with respect to an initial address, the waveform memory including means which is fed with a frequency of the analog signal and a frequency of the clock to count a number of samples k which is equivalent to one-quarter the period of the analog signal, the waveform memory storing a number of samples which is equal to the sum of a number of samples M to be evaluated and k, the digital signal corresponding to the cosine wave and the digital signal corresponding to the sine wave being derived as two series from a train of digital signals read out from the waveform memory which are offset from each other by k samples.

12. A system according to claim 10 in which the instantaneous amplitude calculation means comprises multiplier means for determining a square signal of the digital signal corresponding to the cosine wave and a square signal of the digital signal corresponding to the sine wave, adder means for adding the square signals together to provide a square amplitude signal, and root means for forming a square root of the square amplitude signal to determine an instantaneous amplitude signal.

13. A system according to one of claim 1, 4, 5, 6 or 9 in which the Hilbert pair resampling means includes a pair of waveform memories which store output digital signals from the analog-to-digital converter, further including means for reading out the digital signal corresponding to the cosine wave from one of the waveform memories and reading out the digital signal corresponding to the sine wave from the other waveform memory.

14. A system according to claim 13 in which one of the pair of the waveform memories stores a number of samples which is by an amount corresponding to one-quarter the period of the analog signal greater than the number of samples stored in the other waveform memory.

15. A system according to claim 13 in which the instantaneous amplitude calculation means comprises: multiplier means for determining a square signal of the digital signal corresponding to the cosine wave and a square signal of the digital signal corresponding to the sine wave, adder means for adding the square signals together to provide a square amplitude signal, and root means for forming a square root of the square amplitude signal to determine an instantaneous amplitude signal.

16. A method of evaluating an analog-to-digital converter under test by supplying a wave-shaped analog signal thereto, comprising the steps of:

supplying a wave-shaped analog signal to the analog-to-digital converter under test at a timing determined by a clock;

a Hilbert pair resampling which derives from an output digital signal from the analog-to-digital converter a digital signal corresponding to a cosine wave and a digital wave corresponding to a sine wave each having the period cf analog signal and which are related to each other as a Hilbert transform pair;

calculating an instantaneous amplitude of the digital signal from the digital signal corresponding to the cosine wave and the digital signal corresponding to the sine wave;

deriving a moving difference signal of the instantaneous amplitudes;

and determining a maximum value among the moving difference signals to estimate the differential non-linearity of the analog-to-digital converter.

17. A method according to claim 16 in which the step of determining a maximum value comprises obtaining an absolute magnitude signal of the moving difference signal, and detecting a local maximum thereof in a manner corresponding to the period of the analog signal.

18. A method according to claim 16, further comprising the steps of:

forming an interleaved signal in which the instantaneous amplitudes and the amplitude of the analog signal are interleaved;

deriving a moving difference signal of the interleaved signal;

and determining a maximum value of the moving difference signal to estimate an effective number of bits of the analog-to-digital converter.

19. A method of evaluating an analog-to-digital converter under test by supplying a waved-shaped analog signal thereto, comprising the steps of:

supplying the analog signal to the analog-to-digital converter under test at a timing determined by a clock;

a Hilbert pair resampling which derives from the output digital signal from the analog-to-digital converter a digital signal corresponding to a cosine wave and a digital signal corresponding to a sine wave, both having the period of the analog signal and which are related to each other as a Hilbert transform pair;

calculating an instantaneous amplitude of the digital signal from the digital signal corresponding to the cosine wave and the digital signal corresponding to the sine wave;

forming a interleaved signal in which the instantaneous amplitude and the amplitude of the analog signal are interleaved;

a first transform step for applying a wavelet transform to the interleaved signal;

a second transform step applying a wavelet transform to the wavelet transformed signal;

and determining a maximum value of the transform output from the second transform step to estimate the differential non-linearity of the analog-to-digital converter.

20. A method according to claim 19 in which the wavelet transform output from the first transform step is over-sampled before it is supplied to the second transform step.

21. A method according to claim 19 in which the step of determining a maximum value is a step in which a maximum value of the output from the second transform step is detected in a manner corresponding to the period of the analog signal.

22. A method according to claim 19 in which a high pass filtering is applied in the second transform step and a low pass filtering is applied in the first transform step.

23. A method according to claim 19, further comprising the step of determining a maximum value of the output from the first transform step to estimate an effective number of bits of the analog-to-digital converter.

24. A method according to one of claim 16, 18, 19, 20, 22 or 23 in which the Hilbert pair resampling comprises the steps of: storing the output digital signal from the analog-to-digital converter in a waveform memory, and reading out a train of digital signals from the waveform memory to derive from the train of digital signals the digital signal corresponding to the cosine wave and the digital signal corresponding to the sine wave as two series which are offset from each other by substantially one-quarter the period of the analog signal.

25. A method according to claim 24 in which the signal is stored in the waveform memory by a cyclic write-in in which as the write-in proceeds to a last address, the write-in then takes place with respect to an initial address again, a number of samples k which corresponds to one-quarter the period of the analog signal being determined on the basis of frequency of the analog signal and frequency of the clock, the waveform memory storing a number of samples which is equal to the sum of a number of samples M to be evaluated and k, the digital signal corresponding to the cosine wave and the digital signal corresponding to the sine wave being derived as two series which are offset by k samples in the train of digital signals which are read out from the waveform memory.

26. A method according to claim 24 in which the step of calculating the instantaneous amplitude comprises the steps of determining a square signal of the digital signal corresponding to the cosine wave and a square signal of the digital signal corresponding to the sine was e, adding the square signals together to provide a square amplitude signal, and forming a square root of the square amplitude signal to provide the instantaneous amplitude signal.

27. A method according to one of claim 16, 18, 19, 20, 22 or 23 in which the Hilbert pair resampling comprises the steps of storing the output digital signal from the analog-to-digital converter in a pair of waveform memories, reading out a train of digital signals corresponding to the cosine wave from one of the waveform memories and reading out the digital signal corresponding to the sine wave from the other waveform memory.

28. A method according to claim 27 in which one of the pair of the waveform memories stores a number of samples which is by an amount corresponding to one-quarter the period of the analog signal greater than number of samples stored in the other waveform memory.

29. A method according to claim 27 in which the step of calculating the instantaneous amplitude comprises the steps of forming a square signal of the digital signal corresponding to the cosine wave, and a square signal of the digital signal corresponding to the sine wave, adding the square signals together to provide a square amplitude signal, and forming a square root of the square amplitude signal to provide instantaneous amplitude signal.

* * * * *